US012591171B2

(12) United States Patent     (10) Patent No.:   US 12,591,171 B2

Su et al.     (45) Date of Patent:     Mar. 31, 2026

(54) COOLING SYSTEM WITH A PLURALITY OF SUBSTRATES AND PROJECTION DEVICE

(71) Applicant: Coretronic Corporation, Hsin-Chu (TW)

(72) Inventors: Shao-Peng Su, Hsin-Chu (TW); Te-Ying Tsai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 274 days.

(21) Appl. No.: 18/427,824

(22) Filed: Jan. 31, 2024

(65) Prior Publication Data

US 2024/0268061 A1     Aug. 8, 2024

(30) Foreign Application Priority Data

Feb. 2, 2023    (CN) ......................... 202310051097.8

(51) Int. Cl.
| | |
|---|---|
| *G03B 21/16* | (2006.01) |
| *F21V 29/502* | (2015.01) |
| *F21V 29/54* | (2015.01) |
| *F21V 29/67* | (2015.01) |
| *H05K 7/20* | (2006.01) |

(52) U.S. Cl.
CPC ............ *G03B 21/16* (2013.01); *F21V 29/502* (2015.01); *F21V 29/54* (2015.01); *F21V 29/67* (2015.01);

(Continued)

(58) Field of Classification Search
CPC ........... H05K 7/20136; H05K 7/20145; H05K 7/20154; H05K 7/20163; H05K 7/20409;

(Continued)

(56) References Cited

U.S. PATENT DOCUMENTS

| | | | | |
|---|---|---|---|---|
| 6,428,170 B1 * | 8/2002 | Haba | ......................... | C09K 5/00 |
| | | | | 353/57 |
| 10,962,297 B2 * | 3/2021 | Agonafer | .............. | H01L 23/473 |

(Continued)

FOREIGN PATENT DOCUMENTS

| | | |
|---|---|---|
| CN | 204128084 | 1/2015 |
| CN | 205191975 | 4/2016 |

(Continued)

*Primary Examiner* — Jayprakash N Gandhi
*Assistant Examiner* — Steven Ngo
(74) *Attorney, Agent, or Firm* — JCIPRNET

(57)        ABSTRACT

A cooling system includes a flow channel structure including flow channel substrates, a first outer substrate, a first inner adsorption layer, a first outer adsorption layer, and a first heat insulating layer and a first cooling chip having a cold side and a hot side opposite to each other. The flow channel substrates surround to form an air flow channel and include a first inner substrate with a second surface facing the air flow channel and a first surface disposed on the cold side. A first surface of the first outer substrate is disposed on the hot side. The first inner adsorption layer is disposed on the second surface of the first inner substrate. The first outer adsorption layer is disposed on a second surface of the first outer substrate. The first heat insulating layer is disposed between the first inner substrate and the first outer substrate.

19 Claims, 15 Drawing Sheets

(52) U.S. Cl.
CPC ..... *H05K 7/20136* (2013.01); *H05K 7/20154* (2013.01); *H05K 7/20181* (2013.01); *H05K 7/20409* (2013.01); *H05K 7/20436* (2013.01); *H05K 2201/066* (2013.01); *H05K 2201/10219* (2013.01)

(58) Field of Classification Search
CPC ......... H05K 7/20436; H05K 2201/066; H05K 2201/10219; G03B 21/16; F21V 29/502; F21V 29/54; F21V 29/67
See application file for complete search history.

(56) References Cited

U.S. PATENT DOCUMENTS

| | | | | |
|---|---|---|---|---|
| 2007/0291234 | A1* | 12/2007 | Momose | G03B 21/16 |
| | | | | 62/3.2 |
| 2012/0192573 | A1* | 8/2012 | Akiyama | F25B 21/04 |
| | | | | 62/3.2 |
| 2022/0140220 | A1* | 5/2022 | Kim | F25D 31/00 |
| | | | | 136/203 |
| 2023/0205066 | A1* | 6/2023 | Teranishi | H05K 7/20263 |
| | | | | 353/52 |

FOREIGN PATENT DOCUMENTS

| | | | | | | |
|---|---|---|---|---|---|---|
| CN | 107940619 | A | * | 4/2018 | ........... | F24F 3/1405 |
| CN | 209755992 | | | 12/2019 | | |
| CN | 215951616 | U | * | 3/2022 | | |
| CN | 115143547 | A | * | 10/2022 | ............. | F24F 11/72 |
| JP | H0165632 | U | * | 4/1989 | | |
| TW | M516695 | | | 2/2016 | | |

\* cited by examiner

10C3

1

COOLING SYSTEM WITH A PLURALITY OF SUBSTRATES AND PROJECTION DEVICE

CROSS-REFERENCE TO RELATED APPLICATION

This application claims the priority benefit of China application serial no. 202310051097.8, filed on Feb. 2, 2023. The entirety of the above-mentioned patent application is hereby incorporated by reference herein and made a part of this specification.

BACKGROUND

Technical Field

The disclosure relates to a cooling system and a projection device.

Description of Related Art

When a high-brightness projector is projecting, a digital micromirror device (DMD) needs to be cooled down using a cooling chip by means of thermoelectric cooling (TEC), so that the DMD can reach a sufficiently low working temperature. When using the cooling chip to cool down the DMD, if the surface temperature of the cold side of the cooling chip is lower than the ambient dew point temperature, water vapor will condense on the cold side of the cooling chip and condensation water will be produced, which may cause the risk of short circuit and damage to electronic elements on the DMD. In order to prevent condensation water, the common practice is to wrap the cold side of the cooling chip with foam or rubber to block the external air with higher temperature and higher humidity from directly contacting the cold side of the cooling chip, so as to prevent condensation water. However, due to the limitations of the optical-mechanical structure, the encapsulation manner cannot completely seal the cold side of cooling chip to completely block the external air.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a cooling system, which includes a flow channel structure and a first cooling chip. The first cooling chip has a cold side and a hot side opposite to each other. The flow channel structure includes multiple flow channel substrates, a first outer substrate, a first inner adsorption layer, a first outer adsorption layer, and a first heat insulating layer. The flow channel substrates surround to form an air flow channel, so that the flow channel structure has an air flow inlet and an air flow outlet. The flow channel substrates include a first inner substrate. The first inner substrate has a first surface and a second surface opposite to each other. The second surface faces the air flow channel. The first surface of the first inner substrate is disposed in contact with the cold side of the first cooling chip. The first outer substrate has a first surface and a second surface opposite to each other. The first surface of the first outer substrate is disposed in contact with the hot side of the first cooling chip. The first inner adsorption layer is disposed on the second surface of the first inner substrate. The first outer adsorption layer is disposed on the second surface of the first outer substrate. The first heat insulating layer is disposed between the first inner substrate and the first outer substrate and surrounds the first cooling chip.

The disclosure also provides a projection device, which includes a case, a projection system, and a cooling system. The projection system is disposed in the case and is configured to project an image out of the projection device. The cooling system is disposed in the case and is configured to guide an air flow to cool at least part of the projection system after dehumidifying and cooling down the air flow entering the case. The cooling system includes a flow channel structure and a first cooling chip. The first cooling chip has a cold side and a hot side opposite to each other. The flow channel structure includes multiple flow channel substrates, a first outer substrate, a first inner adsorption layer, a first outer adsorption layer, and a first heat insulating layer. The flow channel substrates surround to form an air flow channel, so that the flow channel structure has an air flow inlet and an air flow outlet. Each of the flow channel substrates has a first surface and a second surface opposite to each other. The first surface of one of the flow channel substrates is disposed in contact with the cold side of the first cooling chip. The first outer substrate has a first surface and a second surface opposite to each other. The first surface of the first outer substrate is disposed in contact with the hot side of the first cooling chip. The first inner adsorption layer is disposed on the second surface of the flow channel substrate in contact with the first cooling chip. The first outer adsorption layer is disposed on the second surface of the first outer substrate. The first heat insulating layer is disposed between the flow channel substrate in contact with the first cooling chip and the first outer substrate and surrounds the first cooling chip.

In order for the features and advantages of the disclosure to be more comprehensible, the following specific embodiments are described in detail in conjunction with the drawings.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

The aforementioned and other technical contents, features, and effects of the disclosure will be clearly presented in the following detailed description of a preferred embodiment with reference to the drawings. Directional terms such as up, down, left, right, front, and back mentioned in the following embodiments are only referring to directions in the attached drawings. Therefore, the directional terms are used to illustrate and not to limit the disclosure.

The disclosure provides a cooling system and a projection device.

Other objectives and advantages of the disclosure can be further understood from the technical features disclosed in the disclosure.

Figure 1A:
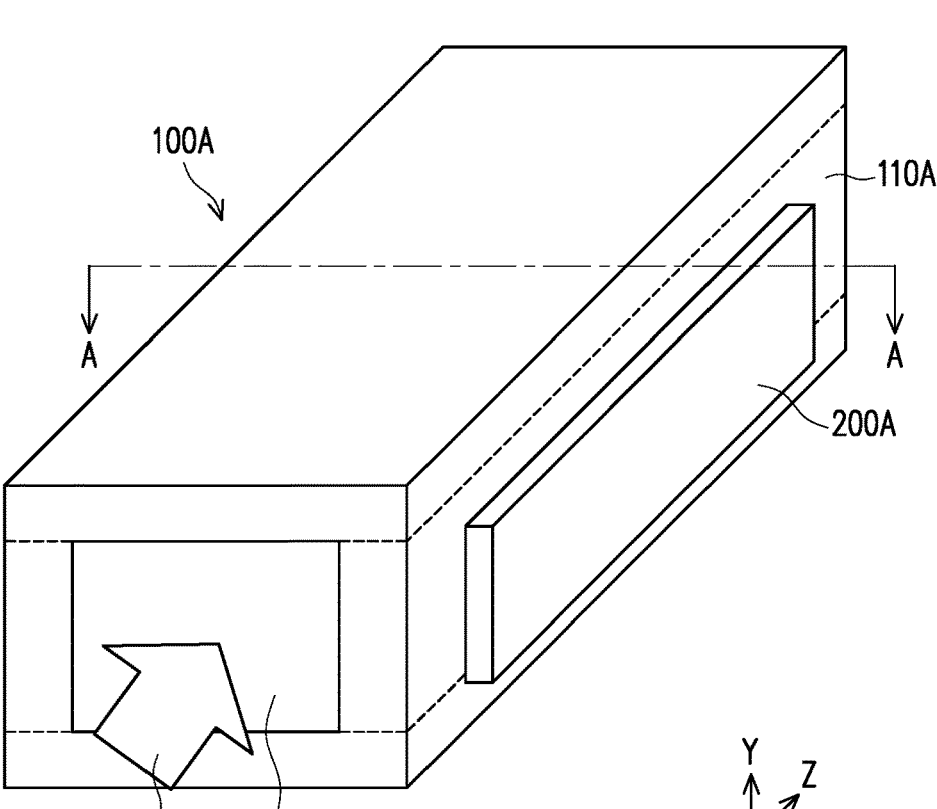
FIG. 1A is a schematic view of a cooling system according to an embodiment of the disclosure.
Figure 1B:
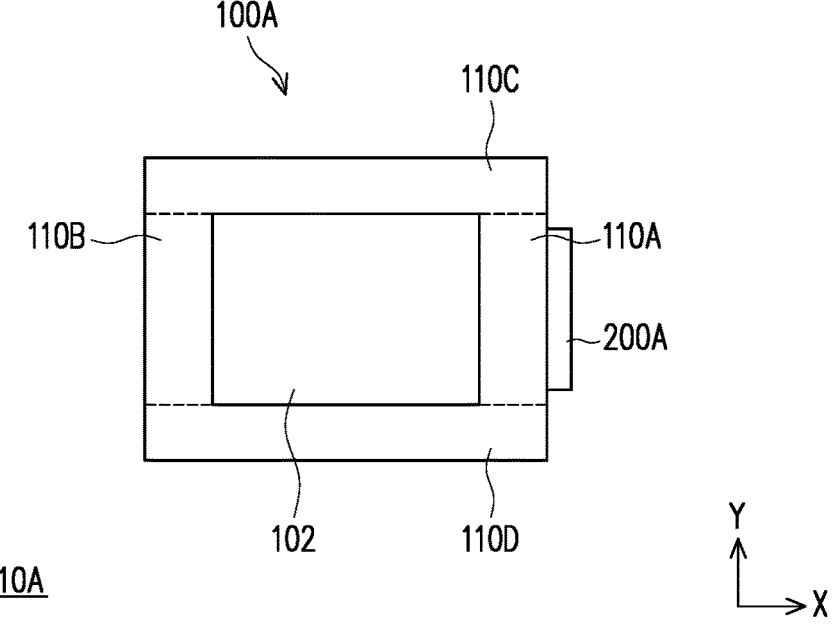
FIG. 1B is a schematic view of a section along a line AA of FIG. 1A.

FIG. 1A is a schematic view of a cooling system according to an embodiment of the disclosure, and FIG. 1B is a schematic view of a section along a line AA of FIG. 1A. As shown in FIG. 1A and FIG. 1B, a cooling system 10A includes a flow channel structure 100A and a first cooling chip 200A. The flow channel structure 100A includes multiple flow channel substrates 110A, 110B, 110C, and 110D. The flow channel substrates 110A, 110B, 110C, and 110D surround to form an air flow channel 102, wherein the flow channel substrates 110A, 110B, 110C, and 110D include a first inner substrate. In the embodiment shown in FIG. 1A, the flow channel substrate 110A is the first inner substrate. The first cooling chip 200A has a cold side and a hot side opposite to each other, and the cold side of the first cooling chip 200A is disposed in contact with the first inner substrate 110A.

In FIG. 1A and FIG. 1B, the material of the first inner substrate 110A (the flow channel substrate) in contact with the first cooling chip 200A is a metal heat conducting material. By contacting the metal material of the first inner substrate 110A with the cold side of the first cooling chip 200A, the first inner substrate 110A may form a cold side substrate for cooling an air flow passing through the flow channel structure 100A.

In the embodiment, the materials of the other flow channel substrates 110B, 110C, and 110D of the flow channel structure 100A of FIG. 1A and FIG. 1B are metal heat conducting materials. In some embodiments, the flow channel substrates 110A, 110B, 110C, and 110D are integrally formed or assembled to surround to form the flow channel structure 100A with closed sides. In the embodiment, the cross-sectional shape of the flow channel structure 100A surrounded by the flow channel substrates 110A, 110B, 110C, and 110D on an XY plane (the section of the line AA) is, for example, a rectangle (that is, the cross-section of the air flow channel 102 is a rectangle).

Figure 2A:
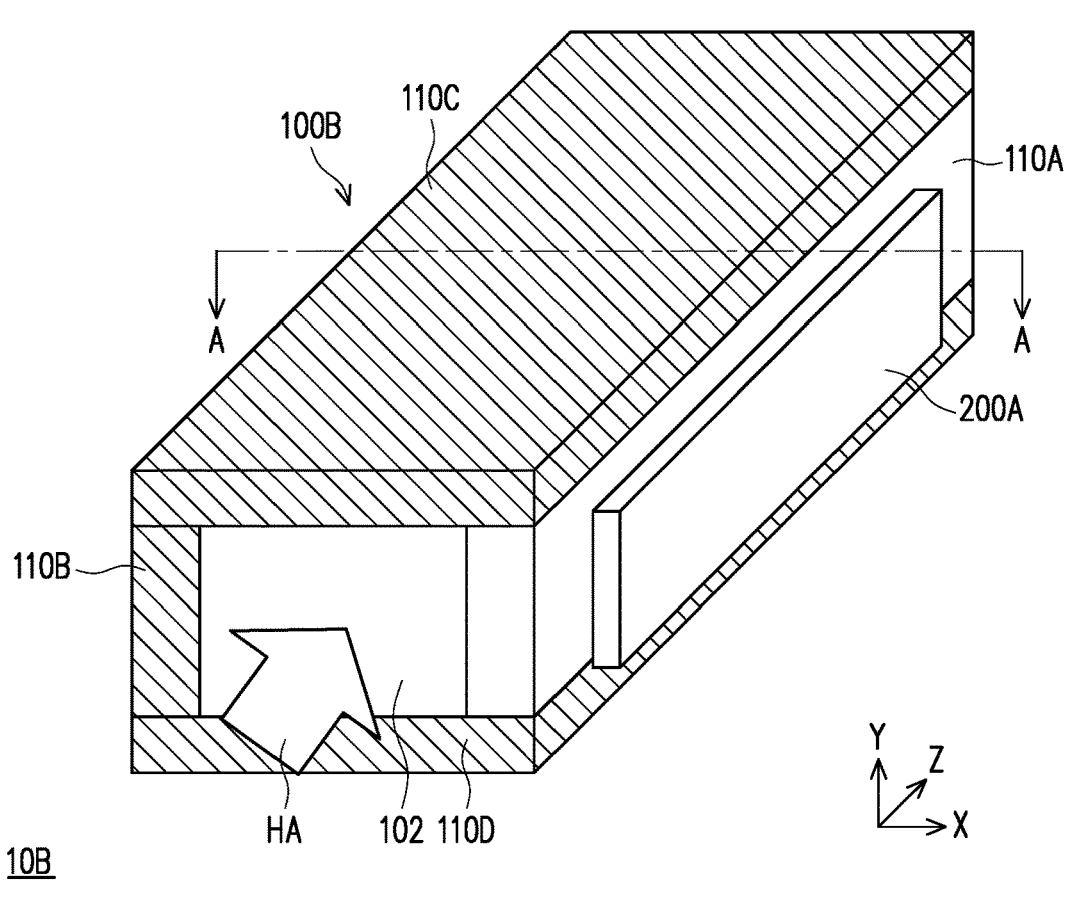
FIG. 2A is a schematic view of a cooling system according to an embodiment of the disclosure.
Figure 2B:
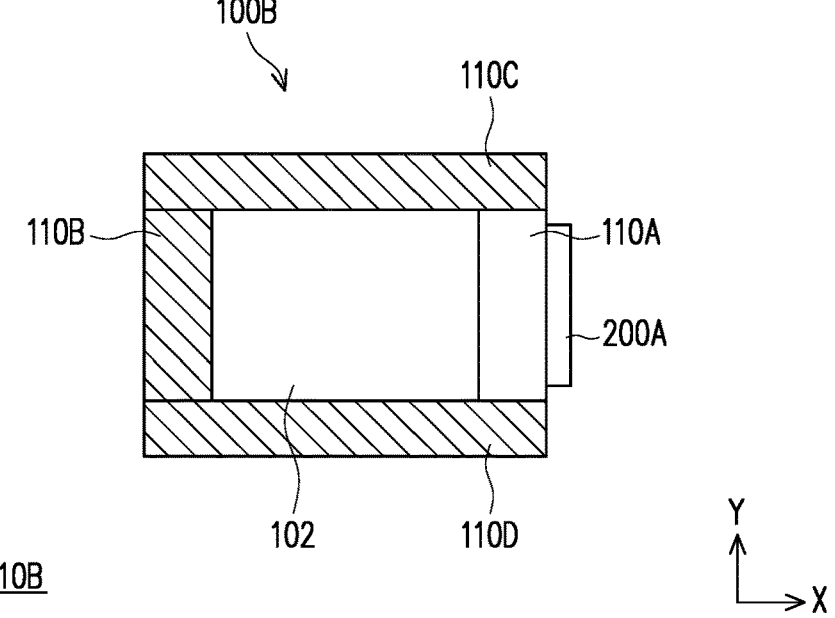
FIG. 2B is a schematic view of a section along a line AA of FIG. 2A.

FIG. 2A is a schematic view of a cooling system according to an embodiment of the disclosure, and FIG. 2B is a schematic view of a section along a line AA of FIG. 2A. A cooling system 10B shown in FIG. 2A and FIG. 2B has a structure similar to that of the cooling system 10A shown in FIG. 1A and FIG. 1B. The cooling system 10B shown in FIG. 2A is different from that of FIG. 1A in that the materials of the flow channel substrates 110B, 110C, and 110D of the cooling system 10B shown in FIG. 2A and FIG. 2B may have different materials from the material of the flow channel substrate 110A (the first inner substrate). For example, the materials of the flow channel substrates 110B, 110C, and 110D are not metal heat conducting materials. In some embodiments, the flow channel substrates 110B, 110C, and 110D may form a system structural member or form an outer casing with the flow channel substrate 110A (the first inner substrate), so as to form the flow channel structure 100B with the closed sides. In the embodiment, the cross-sectional shape of the flow channel structure 100B surrounded by the flow channel substrates 110A, 110B, 110C, and 110D on the XY plane (the section of the line AA) is, for example, a rectangle (that is, the cross-section of the air flow channel 102 is a rectangle).

As shown in FIG. 1A and FIG. 2A, when the flow channel substrates 110A, 110B, 110C, and 110D are assembled to be combined, assembly gaps between the adjacent flow channel substrates may be closed with airtight glue or other blocking elements to close side gaps, so as to reduce the situation where gas with high humidity enters the air flow channel 102 via the gaps.

Figure 3:
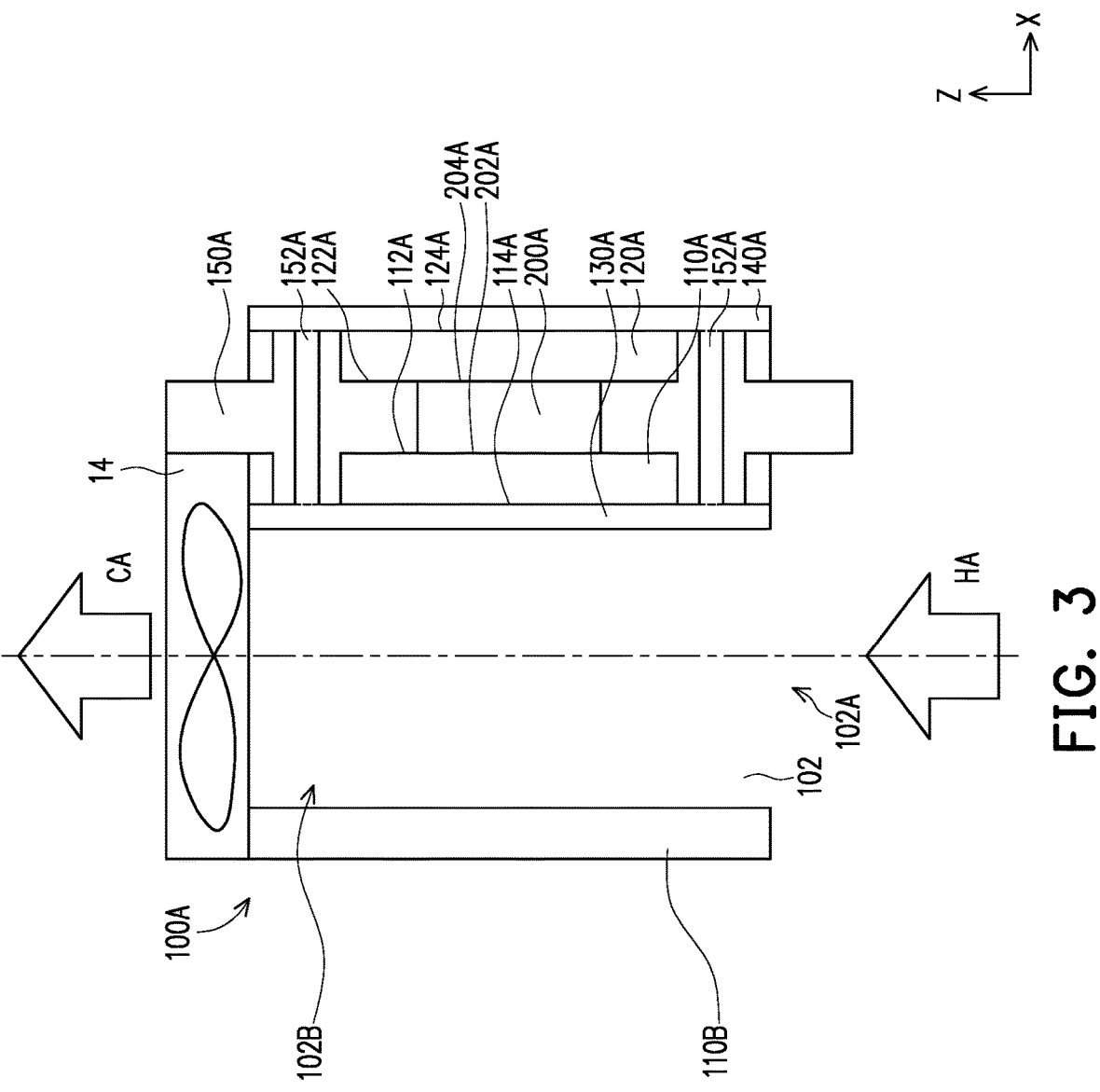
FIG. 3 is a cross-sectional view of a cooling system according to an embodiment of the disclosure.

FIG. 3 is a cross-sectional view of a cooling system according to an embodiment of the disclosure. FIG. 3 shows the cross-sectional view of the cooling system 10A on an XZ plane of the cooling system 10A shown in FIG. 1A and FIG. 1B. The cooling system 10A includes the flow channel structure 100A and the first cooling chip 200A.

The first cooling chip 200A has a cold side 202A and a hot side 204A opposite to each other. The first cooling chip 200A is an active cooling element. When current passes through the first cooling chip 200A, two end surfaces of the first cooling chip 200A may respectively absorb heat and release heat to become the cold side 202A and the hot side 204A, so the temperature can be precisely controlled and the objective of cooling can be implemented.

The flow channel structure 100A includes the flow channel substrates 110A, 110B, 110C, and 110D (the flow channel substrates 110C and 110D are not shown). The flow channel substrates 110A, 110B, 110C, and 110D surround to form the air flow channel 102, so that the flow channel structure 100A has an air flow inlet 102A and an air flow outlet 102B. As shown in FIG. 3, the flow channel substrate 110A and the flow channel substrate 110B are respectively located on two opposite sides of the air flow channel 102.

As shown in FIG. 3, the flow channel structure 100A further includes a first outer substrate 120A, a first inner adsorption layer 130A, a first outer adsorption layer 140A, and a first heat insulating layer 150A.

In the embodiment, the flow channel substrate 110A is a first inner substrate. The first inner substrate 110A has a first surface 112A and a second surface 114A opposite to each other. The second surface 114A faces the air flow channel 102, that is, the second surface 114A is an inner wall of the air flow channel 102.

The first surface 112A of the first inner substrate 110A is disposed in contact with the cold side 202A of the first cooling chip 200A. The first outer substrate 120A has a first surface 122A and a second surface 124A opposite to each other. The first surface 122A of the first outer substrate 120A faces the air flow channel 102 and is disposed in contact with the hot side 204A of the first cooling chip 200A.

According to some embodiments, the first inner substrate 110A and the first outer substrate 120A are both metal heat conducting substrates. By respectively directly contacting the cold side 202A and the hot side 204A of the first cooling chip 200A, the first inner substrate 110A having the metal material in contact with the cold side 202A of the first cooling chip 200A serves as a cold side substrate, the first outer substrate 120A having the metal material in contact with the hot side 204A of the first cooling chip 200A serves as a hot side substrate, and the first inner substrate 110A and the first outer substrate 120A may operate similar to the working principle of the first cooling chip 200A. Heat is conducted to the cold side 202A of the first cooling chip 200A through the first inner substrate 110A, and the hot side 204A of the first cooling chip 200A may conduct heat to the first outer substrate 120A.

As shown in FIG. 3, the first inner adsorption layer 130A of the flow channel structure 100A is disposed on the second surface 114A of the first inner substrate 110A, and the second surface 114A is located between the first inner adsorption layer 130A and the first surface 112A. The first outer adsorption layer 140A is disposed on the second surface 124A of the first outer substrate 120A, that is, the second surface 124A is located between the first outer adsorption layer 140A and the first surface 122A.

According to some embodiments, the first inner adsorption layer 130A and the first outer adsorption layer 140A are porous adsorption materials and are configured to adsorb water vapor in the air passing through the air flow channel 102. The porous adsorption material is, for example, diatomaceous earth, Grafo-therm coating material, or a material with a similar effect of absorbing water vapor, and the disclosure is not limited thereto. The first inner adsorption layer 130A, for example, completely covers the second surface 114A of the first inner substrate 110A, and the first outer adsorption layer 140A, for example, completely covers the second surface 124A of the first outer substrate 120A.

As shown in FIG. 3, the flow channel structure 100A further includes the first heat insulating layer 150A. The first heat insulating layer 150A is disposed between the first inner substrate 110A and the first outer substrate 120A and surrounds the first cooling chip 200A. In the embodiment, the first cooling chip 200A has two opposite side surfaces (not labelled) respectively connected to the cold side 202A and the hot side 204A. The area of the first surface 112A of the first inner substrate 110A is greater than that of the cold side 202A of the first cooling chip 200A, the area of the first surface 122A of the first outer substrate 120A is greater than that of the hot side 204A of the first cooling chip 200A, and the first heat insulating layer 150A is filled between the first surface 112A of the first inner substrate 110A, the first surface 122A of the first outer substrate 120A, and the two side surfaces of the first cooling chip 200A.

With the first heat insulating layer 150A disposed between the first inner substrate 110A and the first outer substrate 120A, the first inner substrate 110A serving as the cold side substrate and the first outer substrate 120A serving as the hot side substrate may be prevented from contacting each other, forming thermal short circuit, and reducing the cooling efficiency. By surrounding the first cooling chip 200A with the first heat insulating layer 150A, the influence of external air on the first cooling chip 200A can be reduced to prevent reducing the cooling efficiency of the first cooling chip 200A.

In some embodiments, the material of the first heat insulating layer 150A is heat resistant foam, plastic, and other materials with low heat conductivity, and the disclosure is not limited thereto. In some embodiments, the range of a heat conductivity k of the material of the first heat insulating layer 150A is $k=0.2$ to $0.5$ W/m·K, but the disclosure is not limited thereto.

As shown in FIG. 3, the first heat insulating layer 150A includes multiple vias 152A. Each of the vias 152A is filled with a porous adsorption material and is connected to the first inner adsorption layer 130A and the first outer adsorption layer 140A.

In some embodiments, the porous adsorption material filled in the vias 152A is the same as the porous adsorption materials of the first inner adsorption layer 130A and the first outer adsorption layer 140A.

As shown in FIG. 3, the second surface 114A of the first inner substrate 110A away from the first cooling chip 200A is coated with the porous material of the first inner adsorption layer 130A, the second surface 124A of the first outer substrate 120A away from the first cooling chip 200A is coated with the porous material of the first outer adsorption layer 140A, and the first inner adsorption layer 130A and the first outer adsorption layer 140A are connected to each other with the porous adsorption material in the via 152A. Therefore, when air HA with high temperature and high humidity passes through the air flow channel 102, the air HA with high temperature and high humidity is cooled (heat energy is adsorbed) by the second surface 114A of the first inner substrate 110A, is condensed on the second surface 114A of the first inner substrate 110A to form water vapor, and is adsorbed by the porous adsorption material of the first inner adsorption layer 130A. The water vapor adsorbed by the first inner adsorption layer 130A passes through the porous adsorption material in the via 152A and is transferred to the first outer adsorption layer 140A by capillary action, and the water vapor is discharged from the cooling system 10A by evaporation.

As shown in FIG. 3, the cooling system 10A further includes a fan 14 disposed on one of the air flow inlet 102A and the air flow outlet 102B of the air flow structure 100A. In FIG. 3, the fan 14 is located at the position of the air flow outlet 102B and is configured to discharge air CA passing through the air flow channel 102. In some other embodiments, the fan 14 may be located at the position of the air flow inlet 102A and is configured to guide the external air HA into the air flow channel 102. In some embodiments, the first heat insulating layer 150A is joined with a side of the fan 14 to prevent the air flow channel 102 from rupturing, causing air in the air flow channel 102 to leak to the outside or the external air that is not cooled and dehumidified to leak into the air flow channel 102. In the embodiments of FIG. 1B and FIG. 3, the fan 14 is, for example, fixed to an end of the flow channel substrates 110A, 110B, 110C, and 110D and connected to the first heat insulating layer 150A.

Figure 4A:
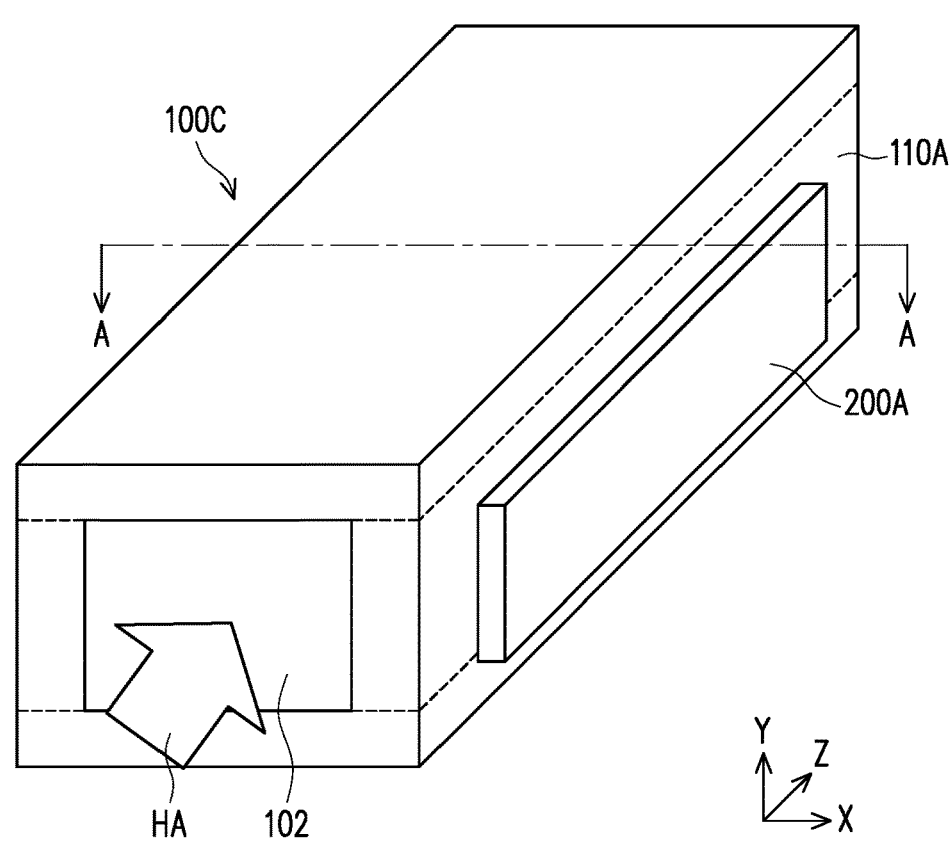
FIG. 4A is a schematic view of a cooling system according to an embodiment of the disclosure.
Figure 4B:
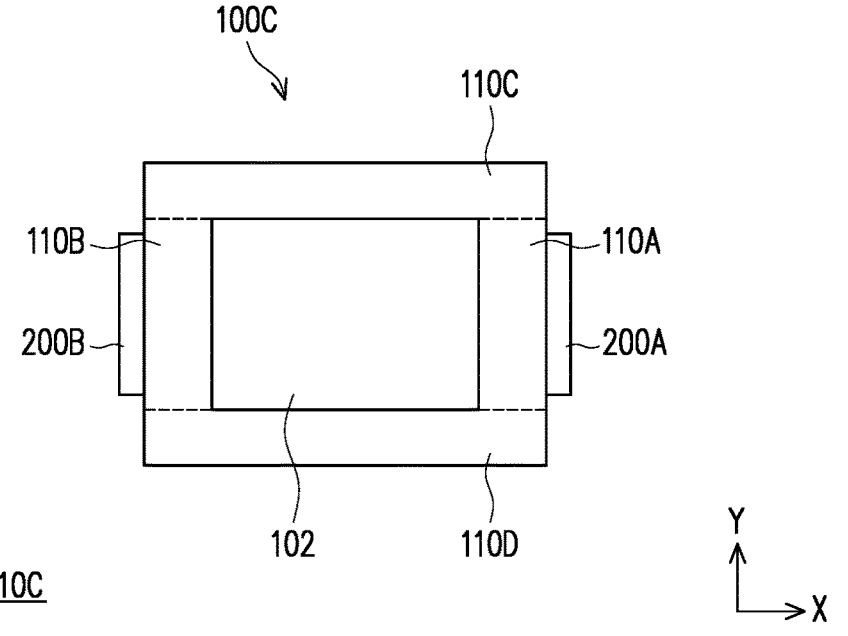
FIG. 4B is a schematic view of a section along a line AA of FIG. 4A.

FIG. 4A is a schematic view of a cooling system according to an embodiment of the disclosure, and FIG. 4B is a schematic view of a section along a line AA of FIG. 4A. A cooling system 10C shown in FIG. 4A is similar to the cooling system 10A shown in FIG. 1A, so the same parts will not be repeated here. The difference between the cooling system 10C shown in FIG. 4A and the cooling system 10A shown in FIG. 1A is that the cooling system 10C further includes a second cooling chip 200B. The flow channel substrate 110B is a second inner substrate 110B. A cold side of the second cooling chip 200B is disposed in contact with the second inner substrate 110B (the flow channel substrate). In the embodiment, the second cooling chip 200B and the first cooling chip 200A are respectively located on the opposite sides of the air flow channel 102. In other embodiments, the second cooling chip 200B may also be located on the flow channel substrate 110C or the flow channel substrate 110D according to actual requirements, and the disclosure is not limited thereto.

In FIG. 4A and FIG. 4B, the material of the second inner substrate 110B in contact with the second cooling chip 200B is a metal heat conducting material. By serving the second inner substrate 110B in contact with the cold side of the second cooling chip 200B as a cold side substrate, air flow passing through the air flow channel 102 may be cooled.

In the embodiment, the materials of the other flow channel substrates 110C and 110D of a flow channel structure 100C of FIG. 4A and FIG. 4B are metal heat conducting materials. In some embodiments, the flow channel substrates 110A, 110B, 110C, and 110D are integrally formed or assembled to surround to form the flow channel structure 100C with closed sides. In the embodiment, the cross-sectional shape of the flow channel structure 100C surrounded by the flow channel substrates 110A, 110B, 110C, and 110D on the XY plane (the section of the line AA) is, for example, a rectangle (that is, the cross-section of the air flow channel 102 is a rectangle).

Figure 5A:
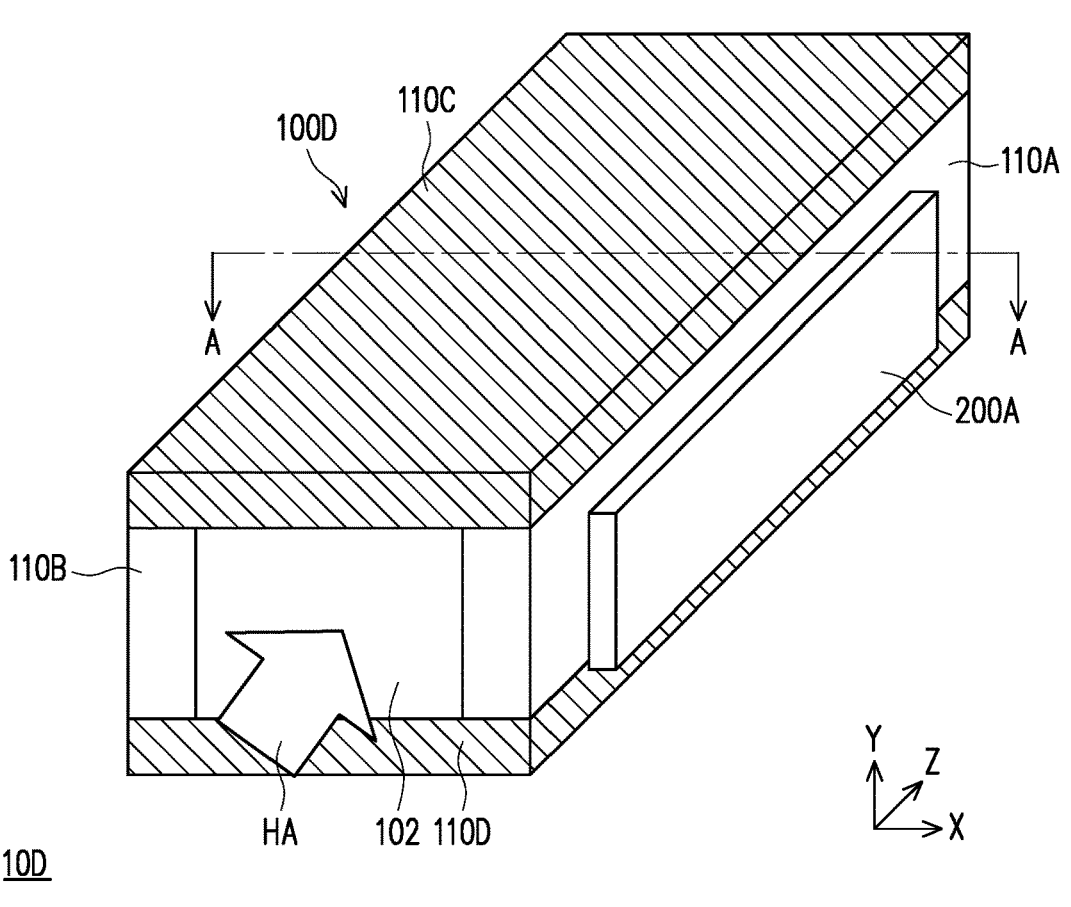
FIG. 5A is a schematic view of a cooling system according to an embodiment of the disclosure.
Figure 5B:
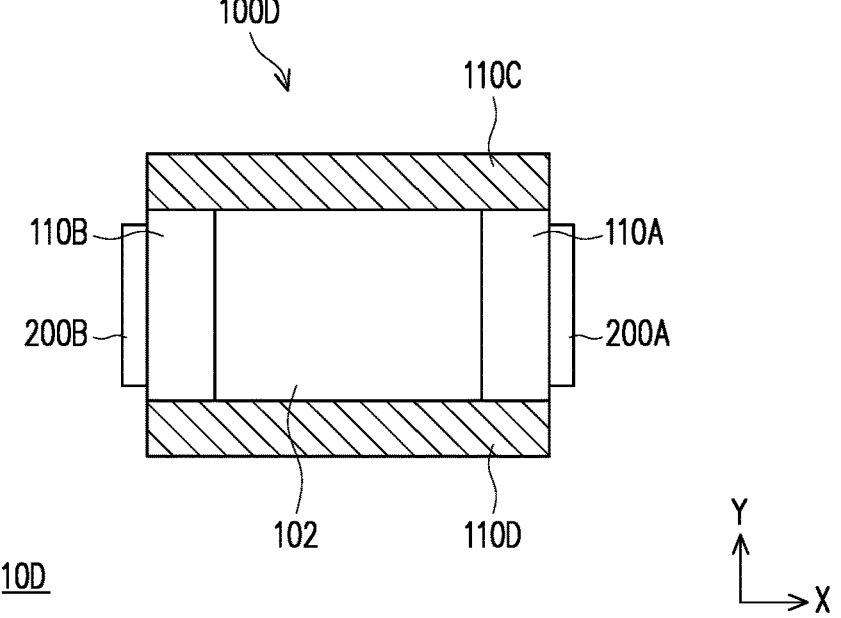
FIG. 5B is a schematic view of a section along a line AA of FIG. 5A.

FIG. 5A is a schematic view of a cooling system according to an embodiment of the disclosure, and FIG. 5B is a schematic view of a section along a line AA of FIG. 5A. A cooling system 10D shown in FIG. 5A and FIG. 5B has a structure similar to that of the cooling system 10C shown in FIG. 4A and FIG. 4B. The difference between FIG. 5A and FIG. 4A is that, in the cooling system 10D, the materials of the flow channel substrates 110C and 110D may be different from the materials of the flow channel substrates 110A and 110B. For example, the materials of the flow channel substrates 110C and 110D are not metal heat conducting materials. In some embodiments, the flow channel substrates 110C and 110D may form a system structural member or form an outer casing with the flow channel substrates 110A and 110B to form a flow channel structure 100D with closed sides. In the embodiment, the cross-sectional shape of the flow channel structure 100D surrounded by the flow channel substrates 110A, 110B, 110C, and 110D on the XY plane (the section of the line AA) is, for example, a rectangle (that is, the cross-section of the air flow channel 102 is a rectangle).

As shown in FIG. 4A and FIG. 5A, when the flow channel substrates 110A, 110B, 110C, and 110D are assembled to be combined, assembly gaps between the adjacent flow channel substrates may be closed with airtight glue or other blocking elements to close side gaps, so as to reduce the situation where gas with high humidity enters the air flow channel 102 via the gaps.

Figure 6:
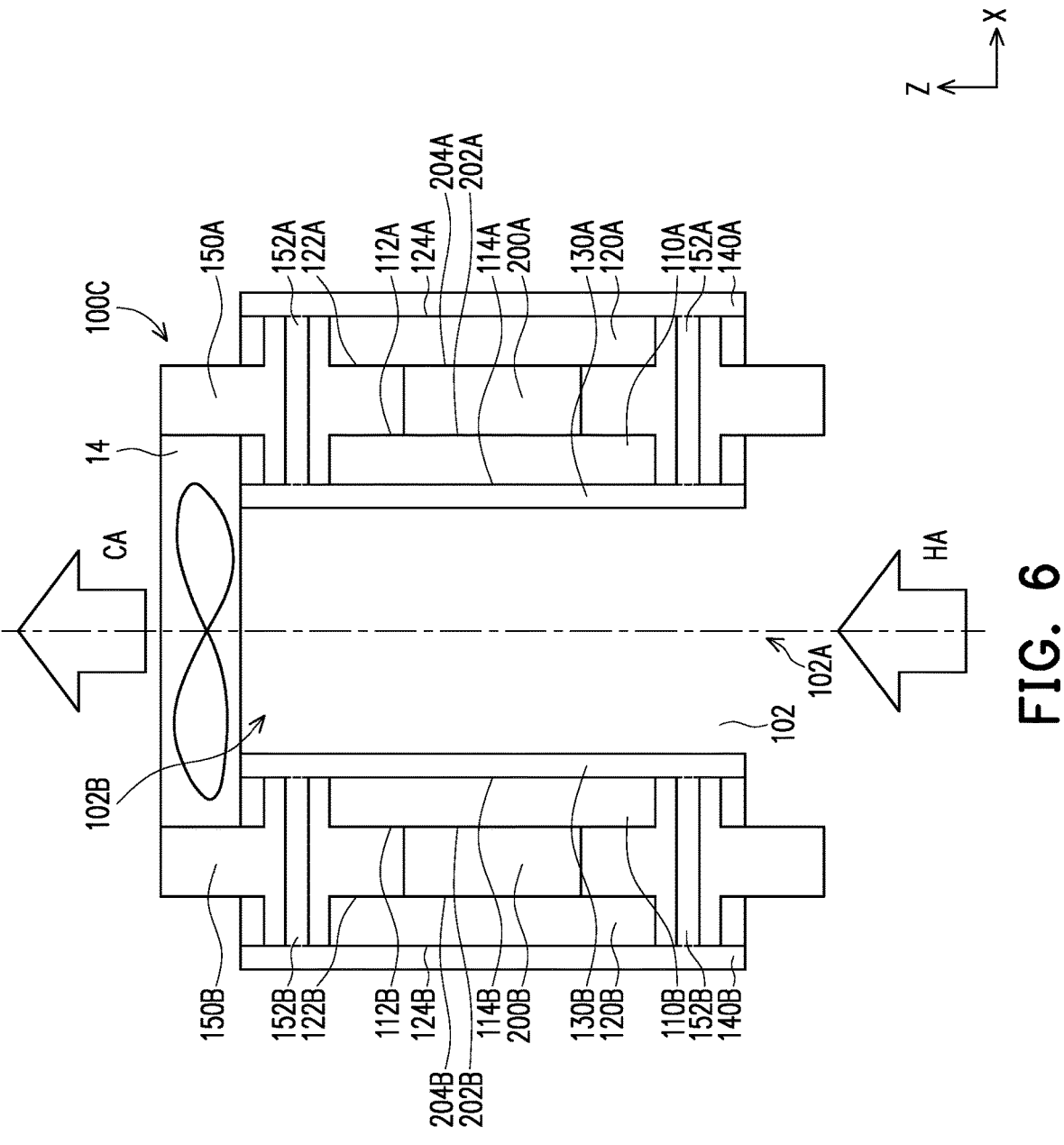
FIG. 6 is a cross-sectional view of a cooling system according to an embodiment of the disclosure.

FIG. 6 is a cross-sectional view of a cooling system according to an embodiment of the disclosure. FIG. 6 shows the cross-sectional view of the cooling system 10C on the XZ plane of the cooling system 10C of FIG. 4A. The cooling system 10C shown in FIG. 6 is similar to the cooling system 10A shown in FIG. 3. The difference is that the cooling system 10C further includes the second cooling chip 200B having a cold side 202B and a hot side 204B opposite to each other.

As shown in FIG. 6, the flow channel structure 100C further includes a second outer substrate 120B, a second inner adsorption layer 130B, a second outer adsorption layer 140B, and a second heat insulating layer 150B.

The second inner substrate 110B (the flow channel substrate) has a first surface 112B and a second surface 114B opposite to each other. The second surface 114B faces the air flow channel 102, that is, the second surface 114B of the second inner substrate 110B is an inner wall of the air flow channel 102. The first surface 112B of the second inner substrate 110B is disposed in contact with the cold side 202B of the second cooling chip 200B. The second outer substrate 120B has a first surface 122B and a second surface 124B opposite to each other. The first surface 122B of the second outer substrate 120B is disposed in contact with the hot side 204B of the second cooling chip 200B.

The second inner adsorption layer 130B of the flow channel structure 100C is disposed on the second surface 114B of the second inner substrate 110B (the flow channel substrate). The second outer adsorption layer 140B is disposed on the second surface 124B of the second outer substrate 120B.

The second heat insulating layer 150B of the flow channel structure 100C is disposed between the second inner substrate 110B and the second outer substrate 120B and surrounds the second cooling chip 200B. In the embodiment, the second cooling chip 200B has two opposite side surfaces (not labelled) respectively connected to the cold side 202B and the hot side 204B. The area of the first surface 112B of the second inner substrate 110B is greater than that of the cold side 202B of the second cooling chip 200B, the area of the first surface 122B of the second outer substrate 120B is greater than that of the hot side 204B of the first cooling chip 200B, and the second heat insulating layer 150B is filled between the first surface 112B of the second inner substrate 110B, the first surface 122B of the second outer substrate 120B, and the two side surfaces of the second cooling chip 200B.

The materials and the properties of the second cooling chip 200B, the second outer substrate 120B, the second inner adsorption layer 130B, the second outer adsorption layer 140B, and the second heat insulating layer 150B are the same as those of the first cooling chip 200A, the first outer substrate 120A, the first inner adsorption layer 130A, the first outer adsorption layer 140A, and the first heat insulating layer 150A. Therefore, there will be no repetition here.

By adding the second cooling chip 200B, the cooling efficiency of the flow channel structure to the gas in the air flow channel 102 can be increased.

Figure 7:
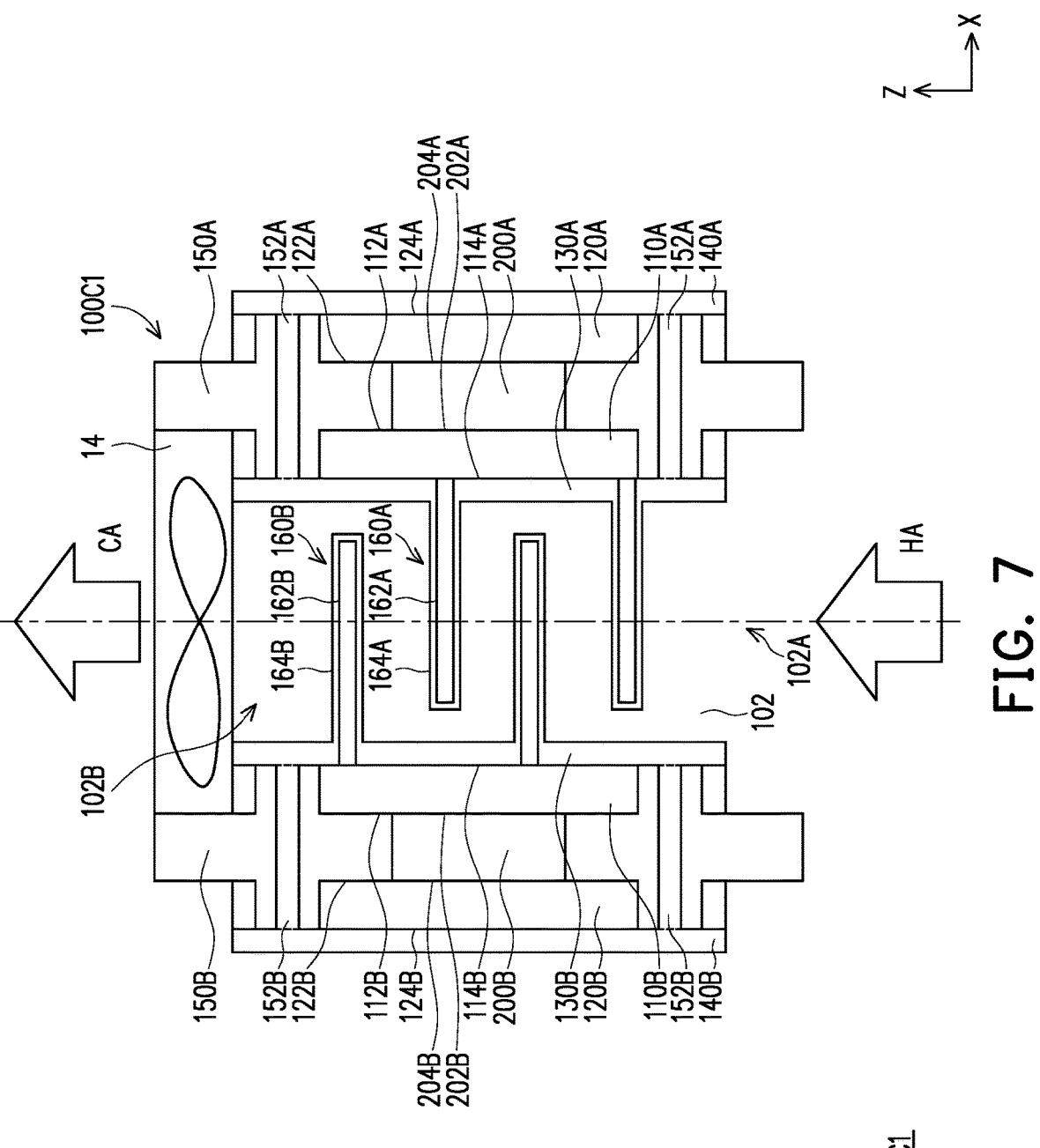
FIG. 7 is a cross-sectional view of a cooling system according to an embodiment of the disclosure.

FIG. 7 is a cross-sectional view of a cooling system according to an embodiment of the disclosure. A cooling system 10C1 shown in FIG. 7 is similar to the cooling system 10C shown in FIG. 6, so the same parts will not be repeated here. The difference between the cooling system 10C1 shown in FIG. 7 and the cooling system 10C shown in FIG. 6 is that a flow channel structure 100C1 further includes a first cold side fin set 160A. The first cold side fin set 160A is disposed on the second surface 114A of the first inner substrate 110A (the flow channel substrate). The first cold side fin set 160A includes multiple fins 162A disposed at intervals and extending from the second surface 114A toward the direction of the center of the air flow channel 102. The fins 162A of the embodiment do not contact the second surface 114B of the second inner substrate 110B (the flow channel substrate) on the opposite side.

By disposing the first cold side fin set 160A on the second surface 114A of the first inner substrate 110A, the contact area between the air HA with high temperature and high humidity in the air flow channel 102 and the fins 162A, the first inner substrate 110A, and the cold side 202A may be increased, thereby increasing the condensation efficiency and the cooling efficiency of water vapor in the air.

In some embodiments, according to actual requirements, the first inner substrate 110A and the first cold side fin set 160A are integrally formed or combined in a detachable manner, and the disclosure is not limited thereto. When the first inner substrate 110A and the first cold side fin set 160A are integrally formed, the first inner substrate 110A and the first cold side fin set 160A may have good heat conduction efficiency, and the structures of the first inner substrate 110A and the first cold side fin set 160A are also stable. When the first inner substrate 110A and the first cold side fin set 160A are combined in a detachable manner, whether to install the first cold side fin set 160A may be determined according to actual requirements.

In some embodiments, each of the fins 162A of the first cold side fin set 160A is configured with a first cold side fin adsorption layer 164A. Therefore, the water vapor of the air in the air flow channel 102 may be condensed on the fins 162A of the first cold side fin set 160A and collected by the first cold side fin adsorption layer 164A. In some embodiments, the material of the first cold side fin adsorption layer 164A is the same as the porous adsorption materials of the first inner adsorption layer 130A and the first outer adsorption layer 140A.

As shown in FIG. 7, the flow channel structure 100C1 of the cooling system 10C1 further has a second cold side fin set 160B disposed on the second surface 114B of the second inner substrate 110B. The second cold side fin set 160B includes multiple fins 162B disposed at intervals and extending from the second surface 114B toward the direction of the center of the air flow channel 102. Each of the fins 162B of the second cold side fin set 160B is configured with a second cold side fin adsorption layer 164B. In the embodiment, the fins 162B do not contact the second surface 114A of the first inner substrate 110A (the flow channel substrate) on the opposite side, and the fins 162B of the second cold side fin set 160B and the fins 162A of the first cold side fin set 160A are staggered, thereby increasing the condensation efficiency and the cooling efficiency of water vapor in the air.

Since the second cold side fin set 160B, the fins 162B, and the second cold side fin adsorption layer 164B have similar materials and structures to the first cold side fin set 160A, the fins 162A, and the first cold side fin adsorption layer 164A, there will be no repetition here.

In some embodiments, only the first cold side fin set 160A is disposed in the first inner substrate 110A, only the second cold side fin set 160B is disposed in the second inner substrate 110B, or the first cold side fin set 160A and the second cold side fin set 160B are both disposed in the first inner substrate 110A and the second inner substrate 110B at the same time according to actual requirements. The disclosure is not limited thereto.

Figure 8:
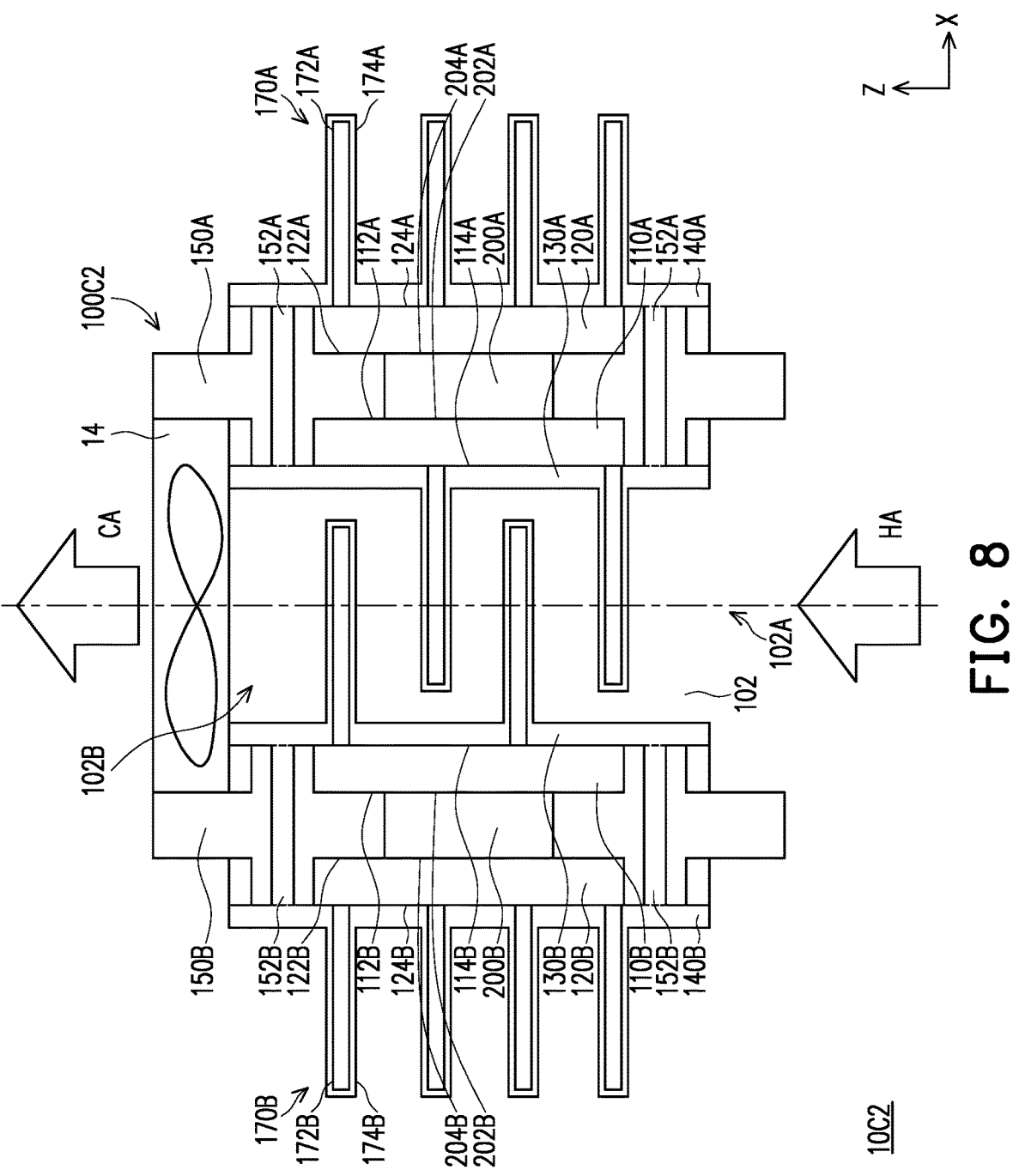
FIG. 8 is a cross-sectional view of a cooling system according to an embodiment of the disclosure.

FIG. 8 is a cross-sectional view of a cooling system according to an embodiment of the disclosure. A cooling system 10C2 shown in FIG. 8 is similar to the cooling system 10C1 shown in FIG. 7, so the same parts will not be repeated here. The difference between the cooling system 10C2 shown in FIG. 8 and the cooling system 10C2 shown in FIG. 7 is that a flow channel structure 100C2 further includes a first hot side fin set 170A. The first hot side fin set 170A is disposed on the second surface 124A of the first outer substrate 120A, and the first hot side fin set 170A includes multiple fins 172A disposed at intervals and extending toward a direction away from the center of the air flow channel 102.

By disposing the first hot side fin set 170A on the second surface 124A of the first outer substrate 120A, the cooling of the first outer substrate 120A may be accelerated, thereby increasing the evaporation efficiency of water vapor on the first outer substrate 120A and the first hot side fin set 170A.

In some embodiments, according to actual requirements, the first hot side fin set 170A and the first outer substrate 120A are integrally formed or combined in a detachable manner, and the disclosure is not limited thereto. When the first outer substrate 120A and the first hot side fin set 170A are integrally formed, the first outer substrate 120A and the first hot side fin set 170A may have good heat conduction efficiency, and the structures of the first outer substrate 120A and the first hot side fin set 170A are also stable. When the first outer substrate 120A and the first hot side fin set 170A are combined in a detachable manner, whether to install the first hot side fin set 170A may be determined according to actual requirements.

In some embodiments, each of the fins 172A of the first hot side fin set 170A is configured with a first hot side fin adsorption layer 174A. Therefore, water vapor condensed on the fins 162A of the first cold side fin set 160A may be collected by the first cold side fin adsorption layer 164A and discharged by evaporation by the fins 172A of the first hot side fin set 170A after passing through the first inner adsorption layer 130A, the porous adsorption material in the via 152A, and the first outer adsorption layer 140A. In some embodiments, the material of the first hot side fin adsorption layer 174A is the same as the porous adsorption materials of the first inner adsorption layer 130A and the first outer adsorption layer 140A.

As shown in FIG. 8, the flow channel structure 100C2 of the cooling system 10C2 further has a second hot side fin set 170B disposed on the second surface 124B of the second outer substrate 120B. The second hot side fin set 170B includes multiple fins 172B disposed at intervals and extending from the second surface 124B toward a direction away from the center of the air flow channel 102. Each of the fins 172B of the second hot side fin set 170B is configured with a second hot side fin adsorption layer 174B.

Since the second hot side fin set 170B, the fins 172B, and the second hot side fin adsorption layer 174B have similar materials and structures to the first hot side fin set 170A, the fins 172A, and the first hot side fin adsorption layer 174A, there will be no repetition here.

In some embodiments, only the first hot side fin set 170A is disposed on the first outer substrate 120A, only the second hot side fin set 170B is disposed on the second outer substrate 120B, or the first hot side fin set 170A and the second hot side fin set 170B are both disposed on the first outer substrate 120A and the second outer substrate 120B at the same time according to actual requirements. The disclosure is not limited thereto.

Figures 9A, 9B, 9C:
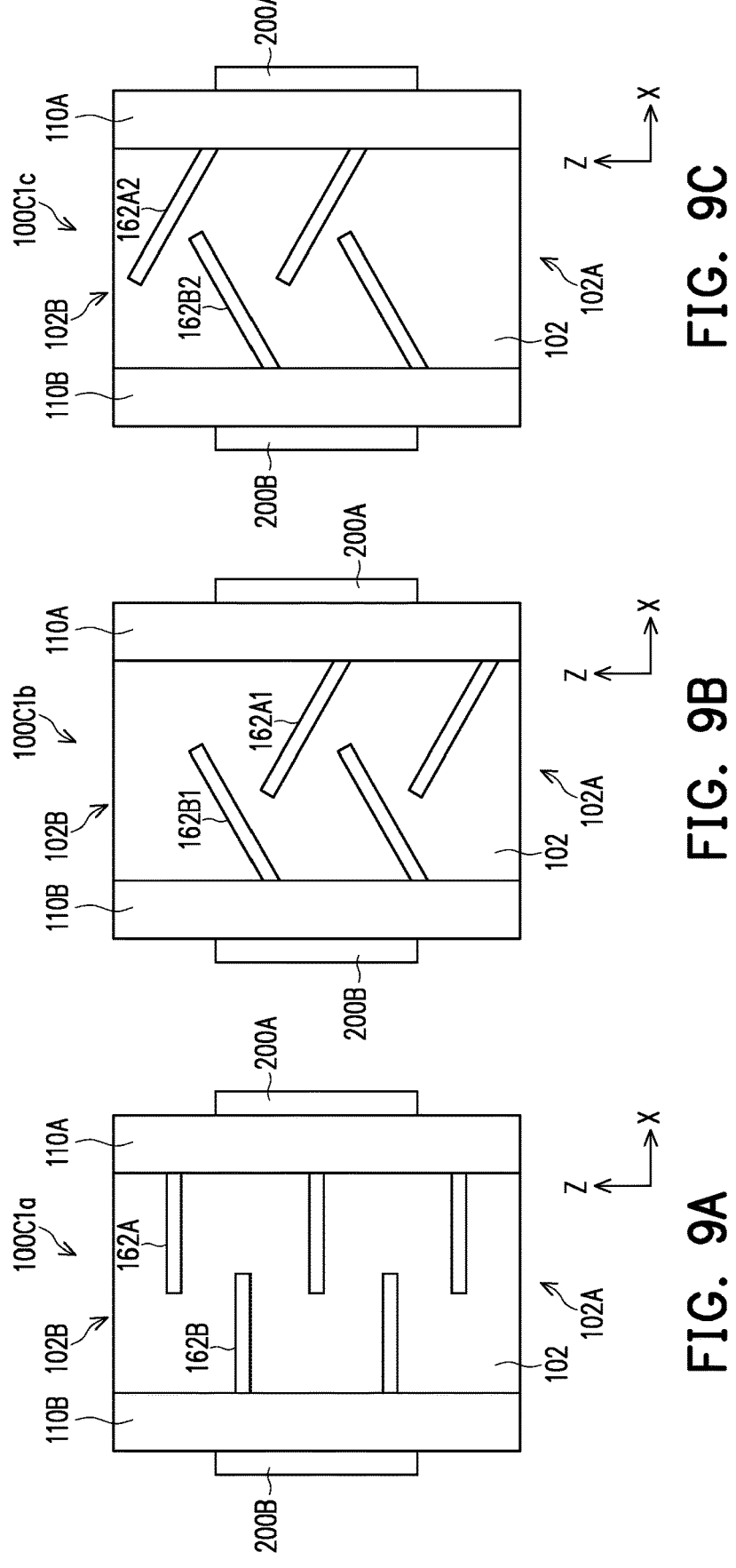
FIG. 9A to FIG. 9C are cross-sectional views of a cooling system according to an embodiment of the disclosure.

FIG. 9A to FIG. 9C are cross-sectional views of a cooling system according to an embodiment of the disclosure. FIG. 9A to FIG. 9C are the cross-sectional views of the cooling system on the XZ plane. Please refer to FIG. 9A. In some embodiments, a flow channel structure 100C1a of FIG. 9A is similar to the flow channel structure 100C1 of FIG. 7, and the second surface 114A of the first inner substrate 110A (the flow channel substrate) of the flow channel structure 100C1a and the second surface 114A of the second inner substrate 110B (the flow channel substrate) of the flow channel structure 100C1a are located on the opposite sides of the air flow channel 102. In addition, the flow channel structure 100C1a has the first cold side fin set 160A disposed on the second surface 114A of the first inner substrate 110A and includes the fins 162A disposed at intervals and the second cold side fin set 160B disposed on the second surface 114A of the second inner substrate 110B and includes the fins 162B disposed at intervals at the same time. In the embodiment, the fins 162A do not contact the second inner substrate 110B (the flow channel substrate) on the opposite side, the fins 162B do not contact the first inner substrate 110 (the flow channel substrate) on the opposite side, and the fins 162B of the second cold side fin set 160B and the fins 162A of the first cold side fin set 160A are staggered, thereby increasing the condensation efficiency and the cooling efficiency of water vapor in the air. The fins 162A and the fins 162B are not in contact with one other. In some embodiments, orthographic projections of each of the fins 162A of the first cold side fin set 160A and each of the fins 162B of the second cold side fin set 160B on a reference plane perpendicular to an extension direction (for example, Z direction) of the air flow channel 102 at least partially overlap. When the orthographic projections of each of the fins 162A of the first cold side fin set 160A and each of the fins 162B of the second cold side fin set 160B on the reference plane perpendicular to the extension direction (for example, Z direction) of the air flow channel 102 at least partially overlap, the number and the area of the fins 162A and the fins 162B that an air flow contacts when passing through the air flow channel 102 can be increased, thereby increasing the effect of air cooling and dehumidification. In other embodiments, the first outer substrate and the second outer substrate of the flow channel structure 100C1a may be respectively disposed on the hot sides of the cooling chips 200A and 200B.

In some embodiments, the arrangement direction of the fins 162A of the first cold side fin set 160A is parallel or not parallel to the arrangement direction of each of the fins 162B of the second cold side fin set 160B.

In some embodiments, as shown in FIG. 9A, the arrangement direction of the fins 162A of the first cold side fin set 160A is parallel to the arrangement direction of each of the fins 162B of the second cold side fin set 160B. In some embodiments, as shown in FIG. 9B, a flow channel structure 100C1b is similar to the flow channel structure 100C1 of FIG. 7, but the arrangement direction of multiple fins 162A1 of a first cold side fin set 160A1 is not parallel to the arrangement direction of each of multiple fins 162B1 of a second cold side fin set 160B1. For example, the fins are staggered in a "herringbone" shape. In some embodiments, as shown in FIG. 9C, a flow channel structure 100C1c is similar to the flow channel structure 100C1 of FIG. 7, but the arrangement direction of multiple fins 162A2 of a first cold side fin set 160A2 is not parallel to the arrangement direction of each of multiple fins 162B2 of a second cold side fin set 160B2. For example, the fins are staggered in a "herringbone" shape. In other embodiments, according to the required flow rate and cooling requirements of air in the air flow channel, the arrangement directions of the fins of the first cold side fin set and the fins of the second cold side fin set may also be other arrangement manners, and the disclosure is not limited thereto.

Figure 10:
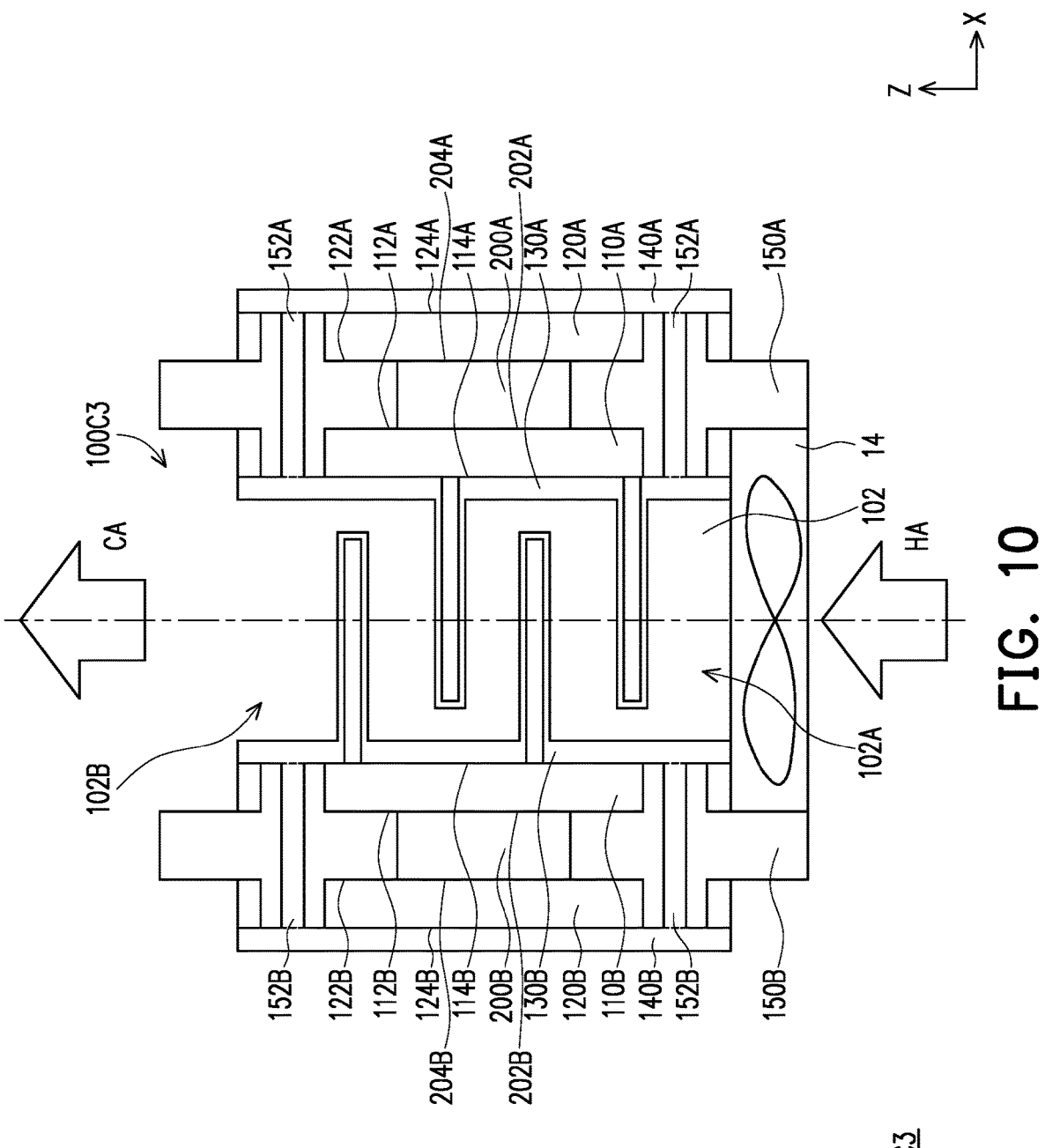
FIG. 10 is a cross-sectional view of a cooling system according to an embodiment of the disclosure.

FIG. 10 is a cross-sectional view of a cooling system according to an embodiment of the disclosure. FIG. 10 is the cross-sectional view of the cooling system on the XZ plane. A cooling system 10C3 shown in FIG. 10 is similar to the cooling system 10C1 shown in FIG. 7, so the same parts will not be repeated here. The difference is that in FIG. 10, the fan 14 of the cooling system 10C3 is located at the air flow inlet 102A of a flow channel structure 100C3 instead of the air flow outlet 102B. Therefore, the fan 14 may be used to draw the external air into the cooling system 10C3 for cooling.

Figure 11:
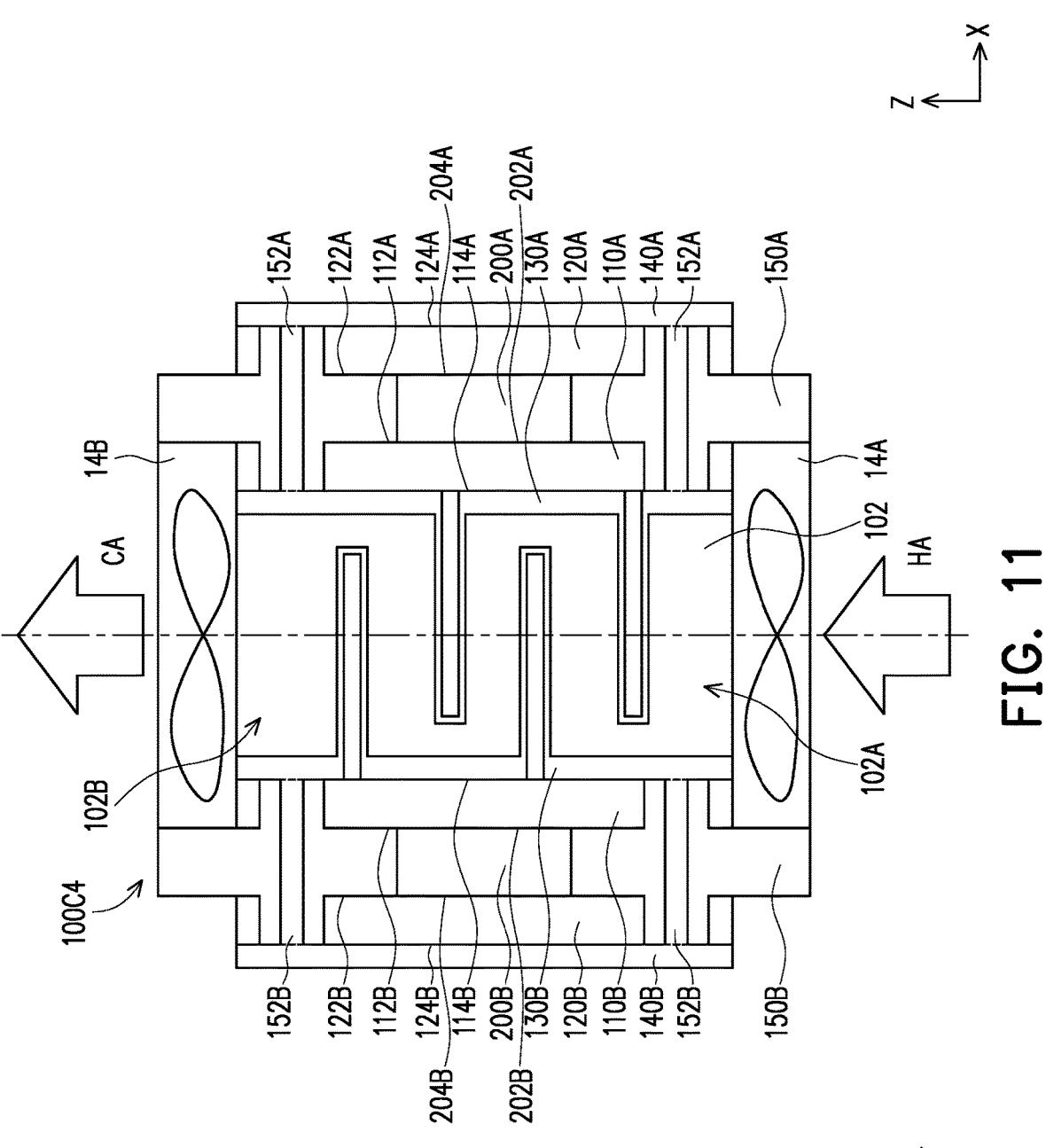
FIG. 11 is a cross-sectional view of a cooling system according to an embodiment of the disclosure.

FIG. 11 is a cross-sectional view of a cooling system according to an embodiment of the disclosure. FIG. 11 is the cross-sectional view of the cooling system on the XZ plane. A cooling system 10C4 shown in FIG. 11 is similar to the cooling systems 10C1 and 10C3 shown in FIG. 7 and FIG. 10, so the same parts will not be repeated here. The difference is that in FIG. 11, the cooling system 10C4 has a first fan 14A located at the air flow inlet 102A of a flow channel structure 100C4 and a second fan 14B located at the air flow outlet 102B. Therefore, the first fan 14A and the second fan 14B operate at the same time and may be used to draw the external air HA into the cooling system 10 for cooling and discharge the air CA cooled by the cooling system 10, so as to accelerate the cooling efficiency of the air.

Figure 12:
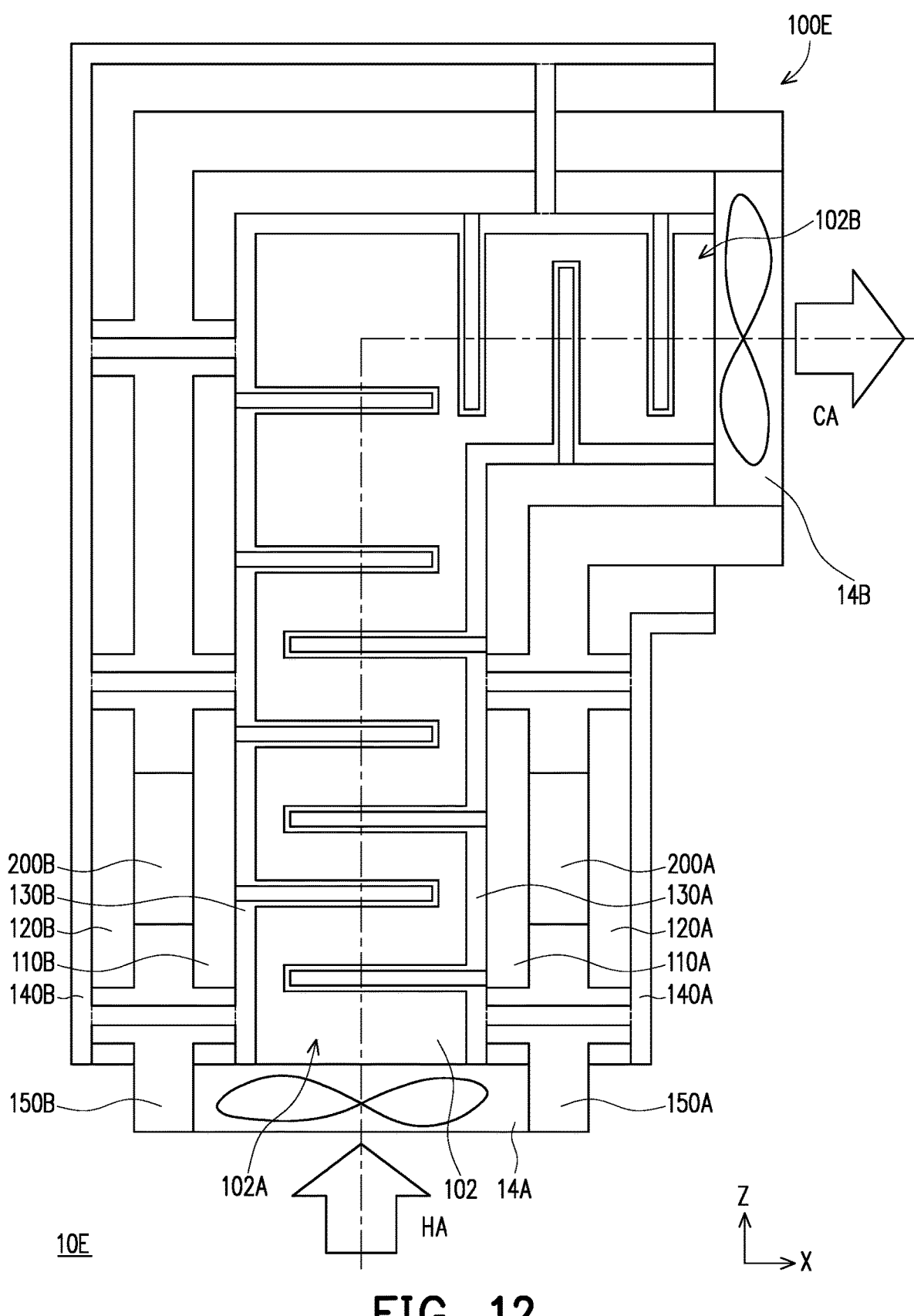
FIG. 12 is a cross-sectional view of a cooling system according to an embodiment of the disclosure.

FIG. 12 is a cross-sectional view of a cooling system according to an embodiment of the disclosure. FIG. 12 is the cross-sectional view of the cooling system on the XZ plane. In the above cooling system, an air inflow direction of the air flow inlet of the flow channel structure is the same as an air outflow direction of the air flow outlet. For example, as shown in FIG. 3, FIG. 6, FIG. 7, FIG. 8, FIG. 10, and FIG. 11, the air inflow direction of the air flow inlet 102A is Z direction and the air outflow direction of the air flow outlet 102B is Z direction. Therefore, the air inflow direction of the air flow inlet 102A is the same as the air outflow direction of the air flow outlet 102B.

In some embodiments, such as a cooling system 10E shown in FIG. 12, the air inflow direction of the air flow inlet 102A of a flow channel structure 100E is Z direction and the air outflow direction of the air flow outlet 102B is X direction. Therefore, the air inflow direction of the air flow inlet 102A is different from the air outflow direction of the air flow outlet 102B. In the embodiment, the air inflow direction of the air flow inlet 102A is perpendicular to the air outflow direction of the air flow outlet 102B.

By changing the air inflow direction of the air flow inlet 102A and the air outflow direction of the air flow outlet 102B, the air flow route in the flow channel structure can be configured more effectively to change the cooling rate and meet configuration requirements in practical applications.

Figure 13A:
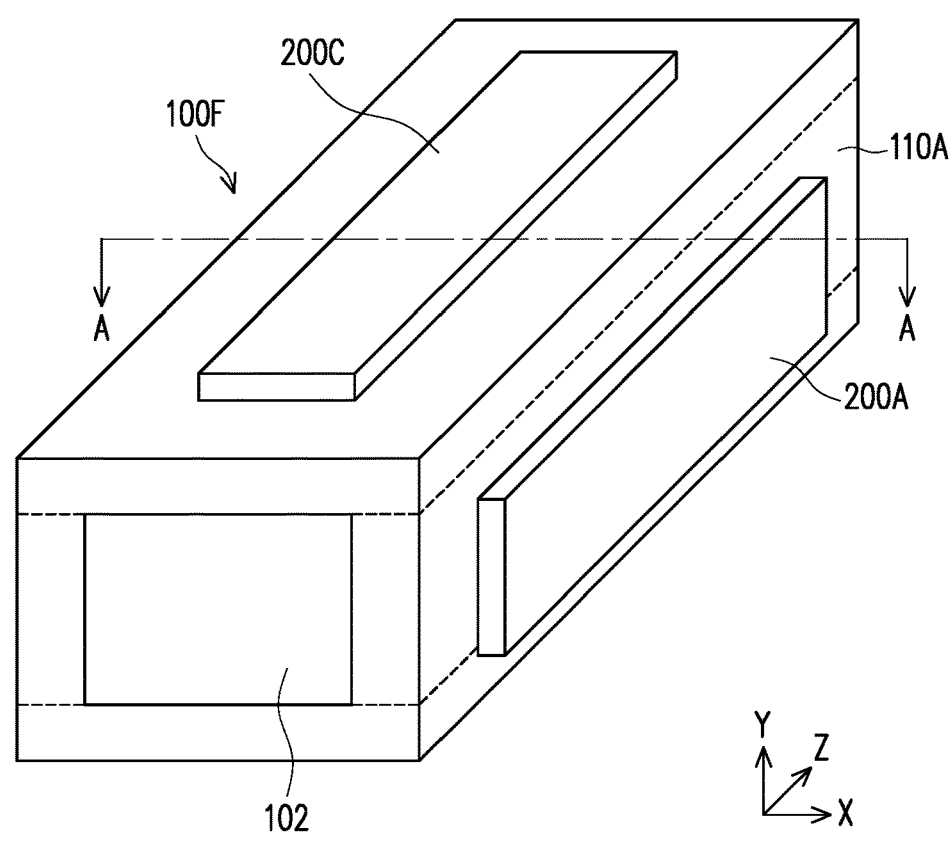
FIG. 13A is a schematic view of a cooling system according to an embodiment of the disclosure.
Figure 13B:
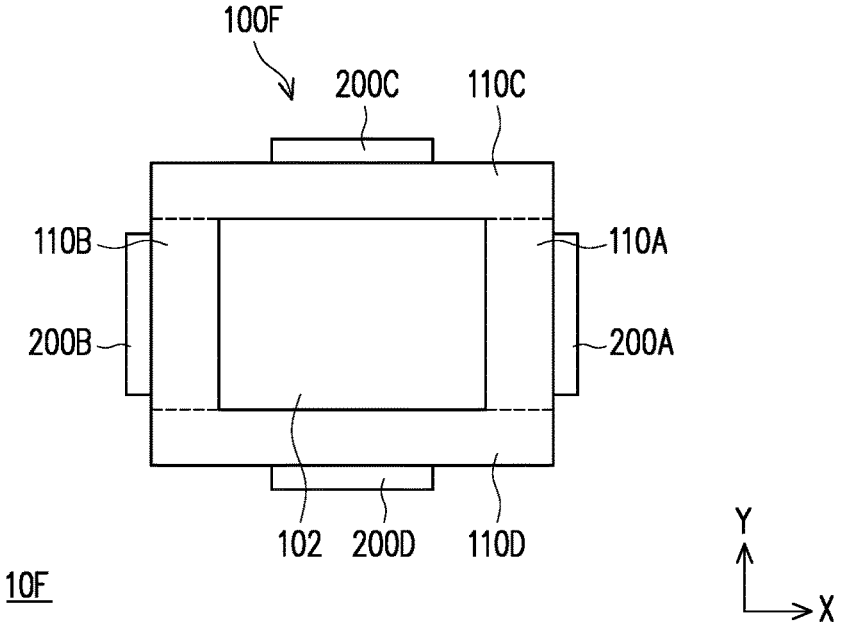
FIG. 13B is a schematic view of a section along a line AA of FIG. 13A.

FIG. 13A is a schematic view of a cooling system according to an embodiment of the disclosure, and FIG. 13B is a schematic view of a section along a line AA of FIG. 13A. A cooling system 10F shown in FIG. 13A is similar to the cooling system 10C shown in FIG. 4A, so the same parts will not be repeated here. The difference between the cooling system 10F shown in FIG. 13A and the cooling system 10C shown in FIG. 4A is that the cooling system 10F further includes a third cooling chip 200C and a fourth cooling chip 200D, and the flow channel substrates 110C and 110D are respectively a third inner substrate and a fourth inner substrate. The cold side of the third cooling chip 200C is disposed in contact with the third inner substrate 110C. The cold side of the fourth cooling chip 200D is disposed in contact with the fourth inner substrate 110D. In the embodiment, the third cooling chip 200C and the fourth cooling chip 200D are respectively located on the opposite sides of the air flow channel 102.

In FIG. 13A and FIG. 13B, the material of the third inner substrate 110C in contact with the third cooling chip 200C is a metal heat conducting material and the material of the fourth inner substrate 110D in contact with the fourth cooling chip 200D is a metal heat conducting material. By contacting the metal material of the second inner substrate 110C with the cold side of the third cooling chip 200C and contacting the metal material of the fourth inner substrate 110D with the cold side of the fourth cooling chip 200D, the third inner substrate 110C and the fourth inner substrate 110D may form cold side substrates for cooling an air flow passing through a flow channel structure 100F.

In the embodiment, the materials of the flow channel substrates 110A, 110B, 110C, and 110D of the flow channel structure 100F of FIG. 13A and FIG. 13B are all metal heat conducting materials. In some embodiments, the flow channel substrates 110A, 110B, 110C, and 110D are integrally formed or assembled to form the flow channel structure 100F with closed sides.

Figure 14:
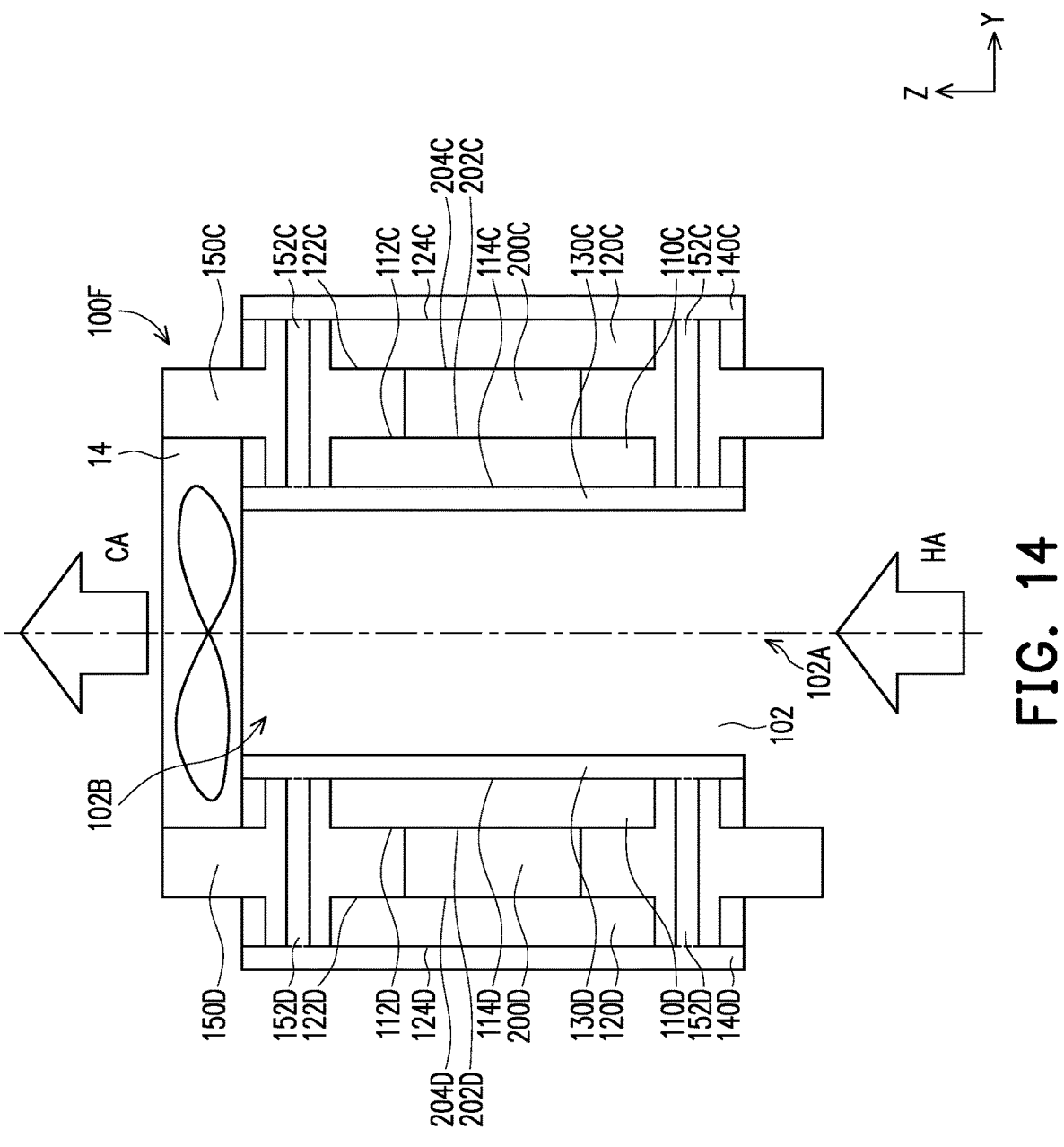
FIG. 14 is a cross-sectional view of a cooling system according to an embodiment of the disclosure.

FIG. 14 is a cross-sectional view of a cooling system according to an embodiment of the disclosure. FIG. 14 is the cross-sectional view of the cooling system 10F on a YZ plane. The cooling system 10F shown in FIG. 14 is a side view of FIG. 13A. The cross-sectional views of the cooling system 10F shown in FIG. 13A and FIG. 13B are similar to that of the cooling system 10A shown in FIG. 6, so there will be no repetition here. In FIG. 14, the cooling system 10F further includes the third cooling chip 200C having a cold side 202C and a hot side 204C opposite to each other and the fourth cooling chip 200D having a cold side 202D and a hot side 204D opposite to each other.

As shown in FIG. 14, the flow channel structure 100F further includes a third outer substrate 120C, a third inner adsorption layer 130C, a third outer adsorption layer 140C, a third heat insulating layer 150C, a fourth outer substrate 120D, a fourth inner adsorption layer 130D, a fourth outer adsorption layer 140D, and a fourth heat insulating layer 150D.

The third inner substrate 110C has a first surface 112C and a second surface 114C opposite to each other. The second surface 114C faces the air flow channel 102. The first surface 112C of the third inner substrate 110C is disposed in contact with the cold side 200C of the third cooling chip 200C. The third outer substrate 120C has a first surface 122A and a second surface 124A opposite to each other. The first surface 122A of the third outer substrate 120C is disposed in contact with the hot side 204C of the third cooling chip 200C.

The third inner adsorption layer 130C is disposed on the second surface 114A of the third inner substrate 110C. The third outer adsorption layer 140C is disposed on the second surface 124A of the third outer substrate 120C.

The third heat insulating layer 150C is disposed between the third inner substrate 110C and the third outer substrate 120C and surrounds the third cooling chip 200C.

The fourth inner substrate 110D has a first surface 112D and a second surface 114D opposite to each other. The second surface 114D faces the air flow channel 102. The first surface 112D of the fourth inner substrate 110D is disposed in contact with the cold side 202D of the fourth cooling chip 200D. The fourth outer substrate 120D has a first surface 122D and a second surface 124D opposite to each other. The first surface 122D of the fourth outer substrate 120D is disposed in contact with the hot side 204D of the fourth cooling chip 200D.

The fourth inner adsorption layer 130D is disposed on the second surface 114D of the fourth inner substrate 110D. The fourth outer adsorption layer 140D is disposed on the second surface 124D of the fourth outer substrate 120D.

The fourth heat insulating layer 150D is disposed between the fourth inner substrate 110D and the fourth outer substrate 120D and surrounds the fourth cooling chip 200D.

By adding the third cooling chip 200C and the fourth cooling chip 200D, the cooling efficiency of the flow channel structure 100F to the gas in the air flow channel 102 can be increased.

Figure 15:
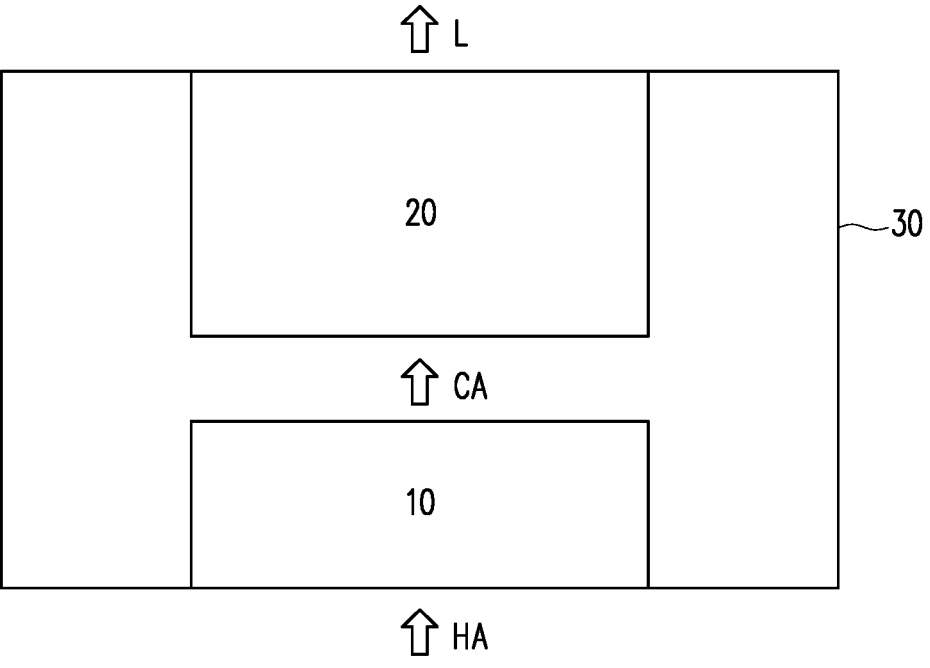
FIG. 15 is a schematic view of a projection device according to an embodiment of the disclosure.

FIG. 15 is a schematic view of a projection device according to an embodiment of the disclosure. As shown in FIG. 15, a projection device 1 includes a case 30, a projection system 20, and a cooling system 10. The projection system 20 and the cooling system 10 are disposed in the case 30. The projection system 20 may include a light source module, a light valve, a projection lens, optical elements for refracting, reflecting, or homogenizing light beams, etc. The projection system 20 is configured to generate an image beam L and project the image beam L out of the projection device 1. The cooling system 10 is configured to dehumidify and cool down an air flow entering the case 30 from the outside or an air flow circulating inside the case 30, and guide the air flow to cool at least a part of elements of the projection system 20. In some embodiments, the cooling system 10 may be the cooling systems as described above in FIG. 1A to FIG. 14.

The cooling system 10 dehumidifies and cools the external air HA with high humidity and high temperature or internal air with high humidity and high temperature into the dry air CA with low temperature to be used to cool down at least a part of elements of the projection system 20, so as to reduce the influence of ambient moisture on the projection system 20. The projection system 20 includes, for example, heat generating devices such as a light source device and a light valve. The cooling system 10 may be configured to cool and dehumidify air (air flow) flowing through the heat generating devices.

On the other hand, in the situation where the power of each cooling chip is the same, the more cooling chips disposed in the cooling system 10, the higher cooling and dehumidification efficiency can be obtained, so that the projection system 20 located downstream of the cooling system 10 (the air flow outlet of the flow channel structure) may obtain air with lower humidity.

In summary, the cooling system of the disclosure can effectively reduce the ambient humidity, so that the air flowing through the cooling system is cold air with lower humidity, such that the heat generating device in the projection system located downstream of the cooling system (the air flow outlet of the flow channel structure) is in an environment with low humidity to not only prevent condensation water on the cooling chip in the cooling system, but also prevent condensation water on the heat generating device in the projection system.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A cooling system, comprising: a flow channel structure and a first cooling chip, wherein the first cooling chip has a cold side and a hot side opposite to each other; and the flow channel structure comprises a plurality of flow channel substrates, a first outer substrate, a first inner adsorption layer, a first outer adsorption layer, and a first heat insulating layer;

the plurality of flow channel substrates surround to form an air flow channel, so that the flow channel structure has an air flow inlet and an air flow outlet, the plurality of flow channel substrates comprise a first inner substrate, the first inner substrate has a first surface and a second surface opposite to each other, the second surface of the first inner substrate faces the air flow channel, and the first surface of the first inner substrate is disposed in contact with the cold side of the first cooling chip;

the first outer substrate has a first surface and a second surface opposite to each other, and the first surface of the first outer substrate is disposed in contact with the hot side of the first cooling chip;

the first inner adsorption layer is disposed on the second surface of the first inner substrate;

the first outer adsorption layer is disposed on the second surface of the first outer substrate; and the first heat insulating layer is disposed between the first inner substrate and the first outer substrate and surrounds the first cooling chip, wherein the first heat insulating layer comprises a plurality of vias, and each of the plurality of vias is filled with a porous adsorption material and is connected to the first inner adsorption layer and the first outer adsorption layer.

2. The cooling system according to claim 1, further comprising: a first fan, disposed on one of the air flow inlet and the air flow outlet.

3. The cooling system according to claim 1, wherein the first inner substrate and the first outer substrate are both metal heat conducting substrates.

4. The cooling system according to claim 3, wherein the plurality of flow channel substrates of the flow channel structure are integrally formed or made of different materials.

5. The cooling system according to claim 1, wherein the first heat insulating layer is joined with a side of a first fan.

6. The cooling system according to claim 1, wherein the first inner adsorption layer and the first outer adsorption layer are made of porous adsorption materials for dehumidification.

7. The cooling system according to claim 3, wherein the flow channel structure further comprises:

a first cold side fin set, disposed on the second surface of the first inner substrate, wherein the first cold side fin set comprises a plurality of fins extending from the second surface of the first inner substrate toward a direction of a center of the air flow channel.

8. The cooling system according to claim 7, wherein the first inner substrate and the first cold side fin set are integrally formed or combined in a detachable manner.

9. The cooling system according to claim 7, wherein each of the plurality of fins of the first cold side fin set is configured with a porous adsorption material.

10. The cooling system according to claim 3, wherein the flow channel structure further comprises:

a first hot side fin set, disposed on the second surface of the first outer substrate, wherein the first hot side fin set comprises a plurality of fins disposed at intervals and extending toward a direction away from a center of the air flow channel.

11. The cooling system according to claim 10, wherein the first hot side fin set and the first outer substrate are integrally formed or combined in a detachable manner.

12. The cooling system according to claim 10, wherein each of the plurality of fins of the first hot side fin set is configured with a porous adsorption material.

13. The cooling system according to claim 1, wherein an air inflow direction of the air flow inlet of the flow channel structure is the same as or different from an air outflow direction of the air flow outlet.

14. The cooling system according to claim 1, further comprising: a second cooling chip, having a cold side and a hot side opposite to each other, wherein the flow channel structure further comprises a second outer substrate, a second inner adsorption layer, a second outer adsorption layer, and a second heat insulating layer, wherein the plurality of flow channel substrates comprise a second inner substrate, the second inner substrate has a first surface and a second surface opposite to each other, the second surface of the second inner substrate faces the air flow channel, and the first surface of the second inner substrate is disposed in contact with the cold side of the second cooling chip;

the second outer substrate has a first surface and a second surface opposite to each other, and the first surface of the second outer substrate is disposed in contact with the hot side of the second cooling chip;

the second inner adsorption layer is disposed on the second surface of the second inner substrate;

the second outer adsorption layer is disposed on the second surface of the second outer substrate;

the second heat insulating layer is disposed between the second inner substrate and the second outer substrate and surrounds the second cooling chip.

15. The cooling system according to claim 14, wherein the second surface of the first inner substrate and the second surface of the second inner substrate are located on opposite sides of the air flow channel;

the flow channel structure further comprises a first cold side fin set and a second cold side fin set, and the first cold side fin set is disposed on the second surface of the first inner substrate and comprises a plurality of fins disposed at intervals, the second cold side fin set is disposed on the second surface of the second inner substrate and comprises a plurality of fins disposed at intervals, wherein orthographic projections of each of the plurality of fins of the first cold side fin set and each of the plurality of fins of the second cold side fin set on a reference plane perpendicular to an extension direction of the air flow channel at least partially overlap.

16. The cooling system according to claim 15, wherein an arrangement direction of the plurality of fins of the first cold side fin set is parallel or not parallel to an arrangement direction of each of the plurality of fins of the second cold side fin set.

17. The cooling system according to claim 2, further comprising: a second fan, disposed on other one of the air flow inlet and the air flow outlet.

18. The cooling system according to claim 14, further comprising: a third cooling chip and a fourth cooling chip, wherein the third cooling chip has a cold side and a hot side opposite to each other, the fourth cooling chip has a cold side and a hot side opposite to each other, and the flow channel structure further comprises a third outer substrate, a third inner adsorption layer, a third outer adsorption layer, a third heat insulating layer, a fourth outer substrate, a fourth inner adsorption layer, a fourth outer adsorption layer, and a fourth heat insulating layer, wherein the plurality of flow channel substrates comprise a third inner substrate and a fourth inner substrate, the first inner substrate, the second inner substrate, the third inner substrate, and the fourth inner substrate surround to form the air flow channel, the third inner substrate has a first surface and a second surface opposite to each other, the second surface of the third inner substrate faces the air flow channel, and the first surface of the third inner substrate is disposed in contact with the cold side of the third cooling chip;

the third outer substrate has a first surface and a second surface opposite to each other, and the first surface of the third outer substrate is disposed in contact with the hot side of the third cooling chip;

the third inner adsorption layer is disposed on the second surface of the third inner substrate;

the third outer adsorption layer is disposed on the second surface of the third outer substrate;

the third heat insulating layer is disposed between the third inner substrate and the third outer substrate and surrounds the third cooling chip;

the fourth inner substrate has a first surface and a second surface opposite to each other, the second surface of the fourth inner substrate faces the air flow channel, and the first surface of the fourth inner substrate is disposed in contact with the cold side of the fourth cooling chip;

the fourth outer substrate has a first surface and a second surface opposite to each other, and the first surface of the fourth outer substrate is disposed in contact with the hot side of the fourth cooling chip;

the fourth inner adsorption layer is disposed on the second surface of the fourth inner substrate;

the fourth outer adsorption layer is disposed on the second surface of the fourth outer substrate;

the fourth heat insulating layer is disposed between the fourth inner substrate and the fourth outer substrate and surrounds the fourth cooling chip.

19. A projection device, comprising: a case, a projection system, and a cooling system, wherein the projection system is disposed in the case and is configured to project an image out of the projection device;

the cooling system is disposed in the case and is configured to guide an air flow entering the case to cool at least a part of the projection system after dehumidifying and cooling down the air flow, the cooling system comprises a flow channel structure and a first cooling chip, wherein the first cooling chip has a cold side and a hot side opposite to each other; and the flow channel structure comprises a plurality of flow channel substrates, a first outer substrate, a first inner adsorption layer, a first outer adsorption layer, and a first heat insulating layer;

the plurality of flow channel substrates surround to form an air flow channel, so that the flow channel structure has an air flow inlet and an air flow outlet, each of the plurality of flow channel substrates has a first surface and a second surface opposite to each other, and the first surface of one of the plurality of flow channel substrates is disposed in contact with the cold side of the first cooling chip;

the first outer substrate has a first surface and a second surface opposite to each other, and the first surface of the first outer substrate is disposed in contact with the hot side of the first cooling chip;

the first inner adsorption layer is disposed on the second surface of the flow channel substrate in contact with the first cooling chip;

the first outer adsorption layer is disposed on the second surface of the first outer substrate; and the first heat insulating layer is disposed between the flow channel substrate in contact with the first cooling chip and the first outer substrate and surrounds the first cooling chip, wherein the first heat insulating layer comprises a plurality of vias, and each of the plurality of vias is filled with a porous adsorption material and is connected to the first inner adsorption layer and the first outer adsorption layer.

* * * * *